US012568848B2

(12) United States Patent
Okaniwa et al.

(10) Patent No.: US 12,568,848 B2
(45) Date of Patent: *Mar. 3, 2026

(54) FILM, LAMINATE, SEMICONDUCTOR WAFER WITH FILM LAYER, SUBSTRATE FOR MOUNTING A SEMICONDUCTOR WITH FILM LAYER, AND SEMICONDUCTOR DEVICE

(71) Applicant: MITSUBISHI GAS CHEMICAL COMPANY, INC., Tokyo (JP)

(72) Inventors: Masashi Okaniwa, Tokyo (JP); Kohei Higashiguchi, Tokyo (JP); Takahito Sekido, Tokyo (JP); Kentaro Takano, Tokyo (JP); Tsuyoshi Kida, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 1007 days.

This patent is subject to a terminal disclaimer.

(21) Appl. No.: 17/621,363

(22) PCT Filed: Jun. 26, 2020

(86) PCT No.: PCT/JP2020/025151

§ 371 (c)(1),
(2) Date: Dec. 21, 2021

(87) PCT Pub. No.: WO2020/262588

PCT Pub. Date: Dec. 30, 2020

(65) Prior Publication Data

US 2022/0344227 A1 Oct. 27, 2022

(30) Foreign Application Priority Data

Jun. 28, 2019 (JP) ................................ 2019-122335

(51) Int. Cl.

| | |
|---|---|
| ***H01L 23/29*** | (2006.01) |
| ***C09D 4/00*** | (2006.01) |
| ***C09D 7/61*** | (2018.01) |
| ***C09D 7/63*** | (2018.01) |

(52) U.S. Cl.

CPC .............. *H01L 23/293* (2013.01); *C09D 4/00* (2013.01); *C09D 7/61* (2018.01); *C09D 7/63* (2018.01)

(58) Field of Classification Search

CPC ........... H01L 23/293; C09D 7/61; C09D 7/63; C09D 4/00

USPC .......................................................... 528/423

See application file for complete search history.

(56) References Cited

U.S. PATENT DOCUMENTS

| | | | | |
|---|---|---|---|---|
| 2017/0012022 | A1 | 1/2017 | Yoshida et al. | |
| 2017/0152418 | A1 | 6/2017 | Aoyama et al. | |
| 2018/0002485 | A1 | 1/2018 | Tanigawa et al. | |
| 2018/0086025 | A1* | 3/2018 | Yoshigahara | C08K 3/08 |
| 2019/0300678 | A1* | 10/2019 | Takiguchi | H01L 21/563 |

FOREIGN PATENT DOCUMENTS

| | | | | |
|---|---|---|---|---|
| EP | 2 755 234 | A1 | 7/2014 | |
| JP | 63-304013 | A | 12/1988 | |
| JP | 5-51418 | A | 3/1993 | |
| JP | 8-302273 | A | 11/1996 | |
| JP | 2001-11142 | A | 1/2001 | |
| JP | 2003-221443 | A | 8/2003 | |
| JP | 2006-245242 | A | 9/2006 | |
| JP | 2011-102345 | A | 5/2011 | |
| JP | 2011-157529 | | 8/2011 | |
| JP | 2011-225639 | A | 11/2011 | |
| JP | 2013-8800 | A | 1/2013 | |
| JP | 2013-112730 | A | 6/2013 | |
| JP | 2014-521754 | A | 8/2014 | |
| JP | 2015-503220 | A | 1/2015 | |
| JP | 2015-189883 | A | 11/2015 | |
| JP | 2016-196548 | A | 11/2016 | |
| JP | 2017-179176 | A | 10/2017 | |
| JP | 2018053092 | A * | 4/2018 | C08L 75/14 |
| JP | 2018-172529 | A | 11/2018 | |
| JP | 2019-99755 | A | 6/2019 | |
| KR | 10-2017-0103873 | A | 9/2017 | |
| KR | 10-2019-0022480 | A | 3/2019 | |
| WO | 2013/018847 | A | 2/2013 | |
| WO | 2013/066597 | A | 5/2013 | |
| WO | 2016/031555 | A1 | 3/2016 | |
| WO | WO-2017209043 | A1 * | 12/2017 | C08K 3/00 |

OTHER PUBLICATIONS

Tanigawa et al., JP 2011-225639 A machine translation in English, Nov. 10, 2011. (Year: 2011).*
Shaanxi Yangchen New Material Technology Co., https://www.yangchentech.com/bmi-200-phenylmethane-maleimide-powder-manufacturer, accessed on Jun. 12, 2025. (Year: 2025).*
Sakauchi, JP 2018-053092 A machine translation in English, Apr. 5, 2018. (Year: 2018).*
International Search Report and Written Opinion of the International Searching Authority issued in International Patent Application No. PCT/JP2020/025151, dated Sep. 15, 2020.

* cited by examiner

*Primary Examiner* — David T Karst
(74) *Attorney, Agent, or Firm* — GREENBLUM & BERNSTEIN, P.L.C.

(57) ABSTRACT

The present application provides a film containing: a compound (A) containing at least one selected from the group consisting of a maleimide compound and a citraconimide compound; an organic peroxide (B) containing at least one selected from the group consisting of organic peroxides represented by specific formulae; and a hydroperoxide (C).

27 Claims, No Drawings

FILM, LAMINATE, SEMICONDUCTOR WAFER WITH FILM LAYER, SUBSTRATE FOR MOUNTING A SEMICONDUCTOR WITH FILM LAYER, AND SEMICONDUCTOR DEVICE

TECHNICAL FIELD

The present invention relates to a film, a laminate using a film, a semiconductor wafer with a film layer, a substrate for mounting a semiconductor with a film layer, and a film. In more detail, the present invention relates to a film that is useful as a pre-applied underfill material.

BACKGROUND ART

In recent years, in association with the downsizing and performance improvement of semiconductor devices, flip chip bonding is getting a lot of attention as a method for mounting a semiconductor chip (hereinafter, may be abbreviated as "chip") on a substrate for mounting a semiconductor (hereinafter, may be abbreviated as "substrate"). In the flip chip bonding, a construction method is common in which, after bonding the chip and the substrate, the gap between the chip and the substrate is filled with an underfill material, which is then cured. However, due to the downsizing and performance improvement of semiconductor devices, the electrode pitch arranged on the chip has become narrower and the gap between the electrodes has also become narrower. As a result, there have been problems that operability is worsened due to a longer time for filling the underfill material, and that filling failures occur, such as unfilling. In response to this, a construction method has been examined in which, after supplying a pre-applied underfill material to the chip or substrate, the joint of the chip and the substrate and the filling of the underfill material are carried out at the same time.

Since the underfill material is a member that comes into direct contact with the chip and the substrate, as important characteristics required for the underfill material, mention may be made of ensuring the optimal melt viscosity in the process of producing semiconductor devices, and suppressing the parts unfilled with the underfill material between the chip and the substrate (hereinafter, may be abbreviated as "voids") in an environment where semiconductor devices are produced and used.

Patent Literature 1 describes a pre-applied underfill material that uses a radical polymerizable monomer as the main resin. In this Patent Literature 1, there is a description that a silane coupling agent is applied for the purpose of improving the adhesiveness to the chip.

Patent Literature 2 describes an underfill material containing an epoxy resin, an imidazole compound, and a maleimide compound.

Patent Literature 3 describes a pre-applied underfill material using an epoxy compound and a carboxyl group containing flux component, and mentions adhesion.

Patent Literature 4 describes a resin composition containing a maleimide compound, an epoxy resin, and an epoxy resin curing agent as essential components, and describes that high adherence was obtained in the resin composition after thermosetting.

Patent Literature 5 describes a resin composition for printed wiring substrates, the resin composition being a thermosetting resin composition used for forming an insulating layer in a printed wiring substrate, and comprising a maleimide compound having a specific structure, a benzoxazine compound, and an inorganic filler (C).

Patent Literature 6 describes an adhesive for electronic components, comprising an aliphatic epoxy compound and a benzoxazine compound as the curing base compounds, and also comprising a phenolic curing agent.

Patent Literature 7 describes an adhesive composition comprising a thermosetting compound, a polymer having a functional group that is capable of reacting with the thermosetting compound, and a thermosetting agent, wherein the adhesive composition has a melt viscosity at a bonding temperature of 10 Pa·s or more and 15000 Pa·s or less, a gelling time at a bonding temperature of 10 seconds or longer, and a gelling time at 240° C. of 1 second or longer and 10 seconds or shorter.

Patent Literature 8 describes a method for producing a semiconductor device using a sheet-type thermosetting resin composition.

In addition, when the joint between a chip and a substrate is carried out via a metal that is easily oxidized, such as solder or copper, a flux component derived from a carboxylic acid or the like may be added to a pre-applied underfill material for the purpose of removing an oxidized metal layer, which is an inhibiting factor for the bonding, and obtaining good metal joint.

CITATION LIST

Patent Literature

Patent Literature 1: Japanese Translation of PCT International Application Publication No. 2015-503220

Patent Literature 2: Japanese Translation of PCT International Application Publication No. 2014-521754

Patent Literature 3: Japanese Patent Application Laid-Open No. 2013-112730

Patent Literature 4: Japanese Patent Application Laid-Open No. 2003-221443

Patent Literature 5: Japanese Patent Application Laid-Open No. 2016-196548

Patent Literature 6: Japanese Patent Application Laid-Open No. 2013-008800

Patent Literature 7: Japanese Patent Application Laid-Open No. 2011-157529

Patent Literature 8: Japanese Patent Application Laid-Open No. 2006-245242

SUMMARY OF INVENTION

Technical Problem

However, radical polymerizable monomers generally cures quickly, and the mobility of the adhesion site of the compounded silane coupling agent is rate-controlled by the main resin that has been polymerized before forming a sufficient number of bonds with the silanol groups on the surface of the chip. As a result, in the pre-applied underfill material described in Patent Literature 1, there is a tendency that the optimal melt viscosity cannot be ensured and sufficient adherence and adhesiveness to chips and substrates such as printed wiring boards cannot be obtained, resulting in the occurrence of voids. In addition, since radical polymerizable monomers cures quickly, the resin composition cures before it is embedded in the unevenness present on the surface of the chip. Therefore, there is a problem that sufficient anchor effect, which is useful in improving adhesiveness, cannot be obtained by the pre-applied underfill material described in Patent Literature 1.

Since the material described in Patent Literature 2 acts only on the polyimide passivation film, there is a problem that the application range is narrow.

In the technique described in Patent Literature 3, reaction between the carboxyl group containing compound and the epoxy compound progresses slightly even at room temperature, and the fluxability is reduced over time during storage. Therefore, the pre-applied underfill material described in Patent Literature 3 has problems such as low stability at the joint and poor mass productivity.

In the technique described in Patent Literature 4, the water absorption rate of the maleimide resin is high, and thus proposing a problem that the chip adhesiveness after the moisture absorption treatment is significantly lowered. When the adhesiveness is insufficient, water penetrates from the delamination interface and the insulation reliability is greatly reduced. Note that it is difficult even for the maleimide resin alone to achieve both adhesiveness with the chips and adhesiveness with the printed wiring substrates.

In Patent Literature 5, there is no description about the fluxability, and no description about the flux component, either. Therefore, the resin composition described in Patent Literature 5 has a problem that good metal joint cannot be obtained.

In Patent Literature 6, although the adhesiveness of the epoxy compound is high, the epoxy compound also reacts with the flux component, thus proposing a problem that fluxability sufficient for obtaining good metal joint cannot be obtained.

The adhesive composition of Patent Literature 7 comprises a thermosetting agent having a flux property, but in Examples, an epoxy compound and a polymer containing an epoxy group are used, and both react at a temperature lower than the bonding temperature. Therefore, it is difficult to obtain sufficient fluxability.

Patent Literature 8 also describes that an epoxy resin is suitable as the thermosetting resin contained in the thermosetting resin composition, but as described above, the epoxy compound also reacts with the flux component, thus proposing a problem that fluxability sufficient for obtaining good metal joint cannot be obtained.

The present invention has been made in view of such problems, and an object of the present invention is to provide a film that is excellent in balance of storage stability, flexibility, fluxability, curability, low void property, and melt viscosity, a laminate, a semiconductor wafer with a film layer, a substrate for mounting a semiconductor with a film layer, and a semiconductor device.

Solution to Problem

The present inventors have, as a result of devoted examinations to solve the above-described problems of the prior art, found out that the above problems can be solved by using a specific component in combination, and reached the present invention.

More specifically, the present invention includes the following contents.

[1]

A film comprising:

a compound (A) comprising at least one selected from the group consisting of a maleimide compound and a citraconimide compound;

an organic peroxide (B) comprising at least one selected from the group consisting of organic peroxides represented by the following formula (1) and the following formula (2); and a hydroperoxide (C).

(1)

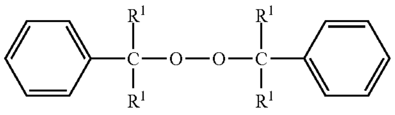

(In the formula (1), each $R^1$ independently represents a hydrogen atom, a methyl group, or an ethyl group.)

(2)

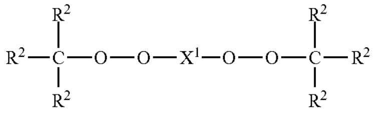

(In the formula (2), each $R^2$ independently represents a hydrogen atom, a methyl group, or an ethyl group, and $X^1$ represents a group represented by the following formula (3) or (4).)

(3)

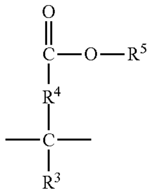

(In the formula (3), $R^3$ represents a hydrogen atom, a methyl group, or an ethyl group, $R^4$ represents an alkylene group having 1 or more and 3 or less carbon atoms, and $R^5$ represents a hydrogen atom or an alkyl group having 1 or more and 6 or less carbon atoms.)

(4)

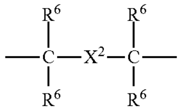

(In the formula (4), each $R^6$ independently represents a hydrogen atom, a methyl group, or an ethyl group, and $X^2$ represents a group represented by the following formulae (a) to (c).)

(a)

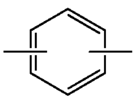

(b)

$-C{\equiv}C-$

-continued (c)

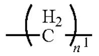

(In the formula (c), n1 represents an integer of 1 or more and 5 or less.)

[2]

The film according to [1], wherein the compound (A) comprises at least one selected from the group consisting of 2,2'-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (5), a maleimide compound represented by the following formula (6), a maleimide compound represented by the following formula (7), a maleimide compound represented by the following formula (8), and a bismaleimide compound having a constituent unit represented by the following formula (9) and maleimide groups at both ends.

(5)

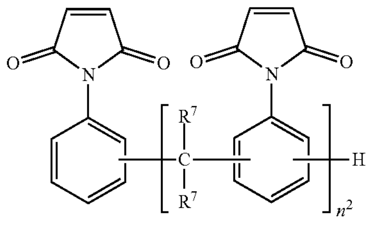

(In the formula (5), each $R^7$ independently represents a hydrogen atom or a methyl group, and n2 represents an integer of 1 or more.)

(6)

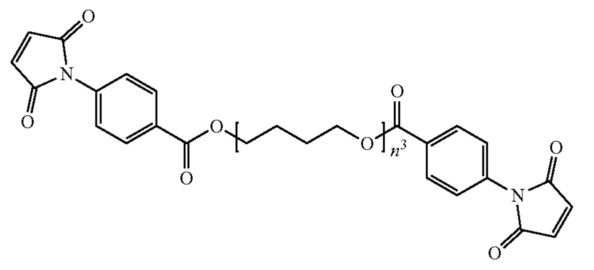

(In the formula (6), n3 represents an integer of 1 or more and 30 or less.)

(7)

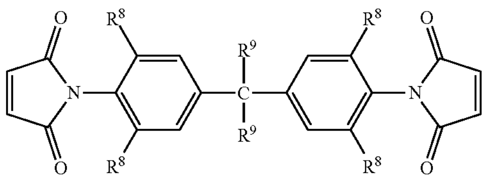

(In the formula (7), each $R^8$ independently represents a hydrogen atom, a methyl group, or an ethyl group, and each $R^9$ independently represents a hydrogen atom or a methyl group.)

(8)

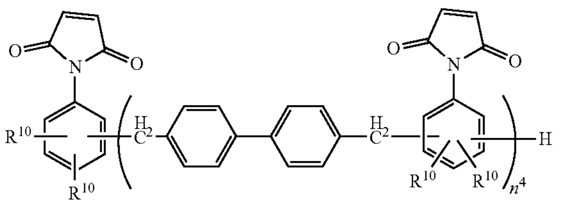

(In the formula (8), each $R^{10}$ independently represents a hydrogen atom, an alkyl group having 1 to 5 carbon atoms, or a phenyl group, and n4 represents an integer of 1 or more and 10 or less.)

(9)

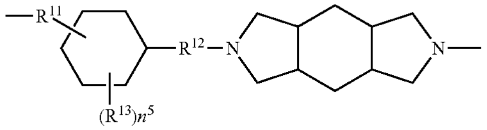

(In the formula (9), $R^{11}$ represents a linear or branched alkylene group having 1 or more and 16 or less carbon atoms, or a linear or branched alkenylene group having 2 or more and 16 or less carbon atoms, $R^{12}$ represents a linear or branched alkylene group having 1 or more and 16 or less carbon atoms, or a linear or branched alkenylene group having 2 or more and 16 or less carbon atoms, each $R^{13}$ independently represents a hydrogen atom, a linear or branched alkyl group having 1 or more and 16 or less carbon atoms, or a linear or branched alkenyl group having 2 or more and 16 or less carbon atoms, and n5 represents an integer of 1 or more and 10 or less.)

[3]

The film according to [2], wherein the compound (A) comprises at least one selected from the group consisting of 2,2'-bis{4-(4-maleimidophenoxy)phenyl}propane, the maleimide compound represented by the above formula (5), the maleimide compound represented by the above formula (6), the maleimide compound represented by the above formula (7), the maleimide compound represented by the above formula (8), and the bismaleimide compound having the constituent unit represented by the above formula (9) and maleimide groups at both ends.

[4]

The film according to any of [1] to [3], wherein the hydroperoxide (C) comprises at least one selected from the group consisting of a hydroperoxide represented by the following formula (10), a hydroperoxide represented by the following formula (11), and a hydroperoxide represented by the following formula (12).

(10)

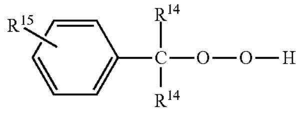

(In the formula (10), each $R^{14}$ independently represents a hydrogen atom or a methyl group, and $R^{15}$ represents a hydrogen atom, a methyl group, an isopropyl group, or a tert-butyl group.)

(11)

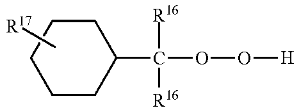

(In the formula (11), each $R^{16}$ independently represents a hydrogen atom or a methyl group, and $R^{17}$ represents a hydrogen atom, a methyl group, an isopropyl group, or a tert-butyl group.)

(12)

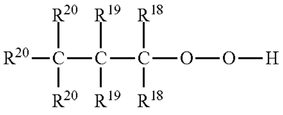

(In the formula (12), each $R^{18}$ independently represents a hydrogen atom or a methyl group, each $R^{19}$ independently represents a hydrogen atom or a methyl group, and each $R^{20}$ independently represents a hydrogen atom or a methyl group.)

[5]

The film according to any of [1] to [4], wherein the hydroperoxide (C) has a molecular weight of 100 or more.

[6]

The film according to any of [1] to [5], wherein the hydroperoxide (C) comprises at least one selected from the group consisting of p-menthane hydroperoxide, diisopropylbenzene hydroperoxide, cumene hydroperoxide, 1,1,3,3-tetramethylbutyl hydroperoxide, and tert-amyl hydroperoxide.

[7]

The film according to any of [1] to [6], wherein the organic peroxide (B) comprises at least one selected from the group consisting of dicumyl peroxide, n-butyl-4,4-di-(tert-butylperoxy) valerate, di(2-tert-butylperoxyisopropyl) benzene, 2,5-dimethyl-2,5-bis(tert-butylperoxy)hexyne-3, and 2,5-dimethyl-2,5-bis(tert-butylperoxy)hexane.

[8]

The film according to any of [1] to [7], further comprising a benzoxazine compound (D) represented by the following formula (13), the following formula (14), the following formula (15), and the following formula (16).

(13)

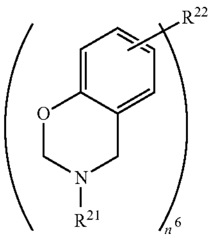

(In the formula (13), each $R^{21}$ independently represents an aryl group, an aralkyl group, an alkenyl group, an alkyl group, or a cycloalkyl group, $R^{22}$ represents a hydrogen atom, an aryl group, an aralkyl group, an alkenyl group, an alkyl group, a cycloalkyl group, or a monovalent to tetravalent organic group represented by the following general formulae (d) to (w), and n6 represents an integer of 1 to 4.)

(14)

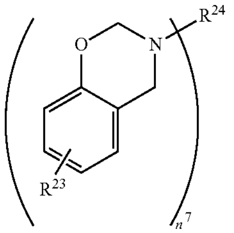

(In the formula (14), each $R^{23}$ independently represents a hydrogen atom, an aryl group, an aralkyl group, an alkenyl group, an alkyl group, or a cycloalkyl group, $R^{24}$ represents an aryl group, an aralkyl group, an alkenyl group, an alkyl group, a cycloalkyl group, or a monovalent to tetravalent organic group represented by the following general formulae (d) to (r), and n7 represents an integer of 1 to 4.)

(15)

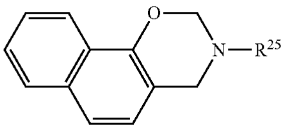

(In the formula (15), $R^{25}$ represents an alkyl group, a cycloalkyl group, or a phenyl group optionally having a substituent.)

(16)

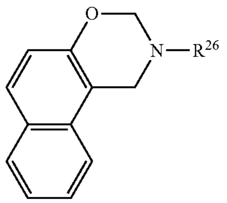

(In the formula (16), $R^{26}$ represents an alkyl group, a cycloalkyl group, or a phenyl group optionally having a substituent.)

(d)

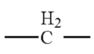

(e)

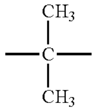

(f)

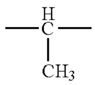

(g)

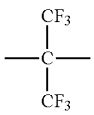

-continued (h)

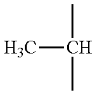

(i)

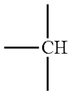

(j)

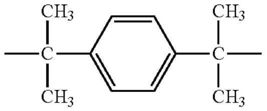

(k)

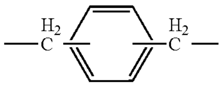

(l)

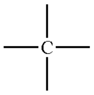

(m)

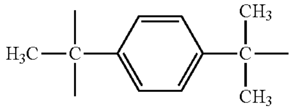

(n)

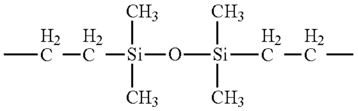

(o)

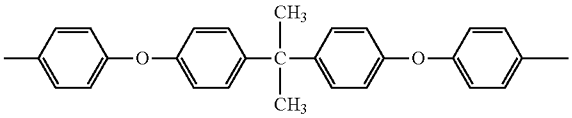

(p)

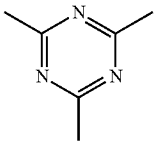

(q)

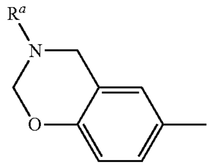

(r)

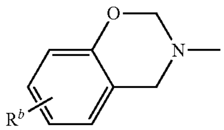

(s)

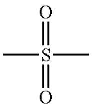

(t)

-continued (u)

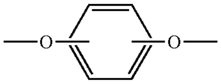

(v)

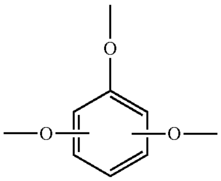

(w)

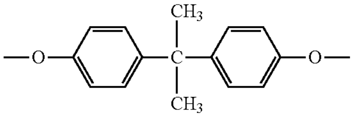

(In the formulae (d) to (w), $R^a$ represents an aryl group, an aralkyl group, an alkenyl group, an alkyl group, or a cycloalkyl group, $R^b$ represents a hydrogen atom, an aryl group, an aralkyl group, an alkenyl group, an alkyl group, or a cycloalkyl group.)

[9]

The film according to [8], wherein the benzoxazine compound (D) comprises at least one selected from the group consisting of compounds represented by the following formula (17) and the following formula (18).

(17)

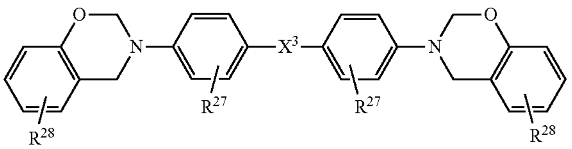

(In the formula (17), each $R^{27}$ independently represents a hydrogen atom, an aryl group, an aralkyl group, an alkenyl group, an alkyl group, or a cycloalkyl group, each $R^{28}$ independently represents a hydrogen atom, an aryl group, an aralkyl group, an alkenyl group, an alkyl group, or a cycloalkyl group, and $X^3$ represents an alkylene group, a group represented by the following formula (19), a group represented by the formula "—$SO_2$—", a group represented by the formula "—CO—", an oxygen atom, or a single bond.)

(18)

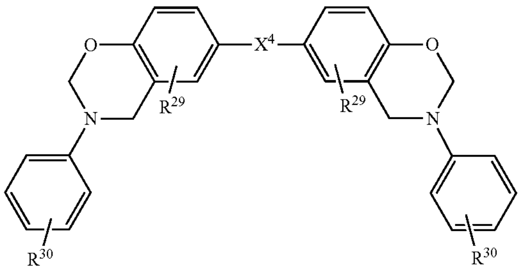

(In the formula (18), each $R^{29}$ independently represents a hydrogen atom, an aryl group, an aralkyl group, an alkenyl group, an alkyl group, or a cycloalkyl group, each $R^{30}$ independently represents a hydrogen atom, an aryl group, an aralkyl group, an alkenyl group, an alkyl group, or a cycloalkyl group, and $X^4$ represents an alkylene group, a group represented by the following formula (19), a group represented by the formula "$-SO_2-$", a group represented by the formula "—CO—", an oxygen atom, or a single bond.)

(19)

$$-O-(Y)_{n8}-O-$$

(In the formula (19), Y is an alkylene group or a hydrocarbon group having 6 or more and 30 or less carbon atoms and having an aromatic ring, and n8 represents an integer of 0 or more.)

[10]

The film according to [8] or [9], wherein the benzoxazine compound (D) comprises at least one selected from the group consisting of a compound represented by the following formula (20), a compound represented by the following formula (21), a compound represented by the following formula (22), a compound represented by the following formula (23), a compound represented by the following formula (24), and a compound represented by the following formula (25).

(20)

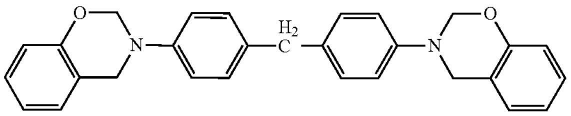

(21)

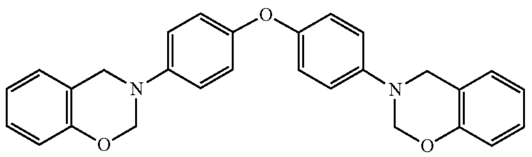

(22)

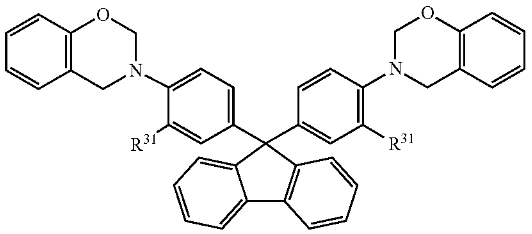

(In the formula (22), each $R^{31}$ independently represents a hydrogen atom or a hydrocarbon group having 1 to 4 carbon atoms.)

(23)

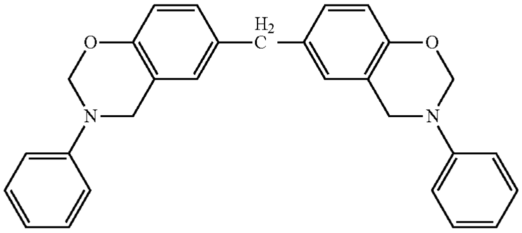

(24)

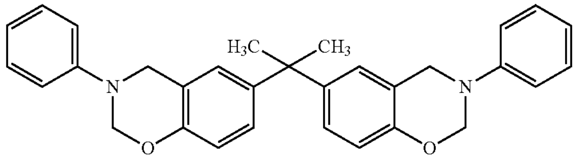

(25)

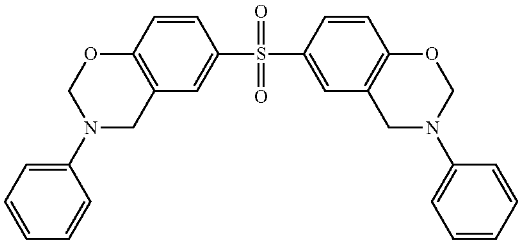

[11]

The film according to any of [8] to [10], wherein a content of the benzoxazine compound (D) is 5 parts by mass or more and 50 parts by mass or less based on 100 parts by mass of the compound (A).

[12]

The film according to any of [1] to [11], further comprising a propenyl compound (E).

[13]

The film according to [12], wherein a content of the propenyl compound (E) is 5 parts by mass or more and 50 parts by mass or less based on 100 parts by mass of the compound (A).

[14]

The film according to any of [1] to [13], further comprising a flux component (F).

[15]

The film according to [14], wherein a content of the flux component (F) is 5 parts by mass or more and 60 parts by mass or less based on 100 parts by mass of the compound (A).

[16]

The film according to any of [1] to [15], further comprising an inorganic filler (G).

[17]

The film according to [16], wherein the inorganic filler (G) has an average particle diameter of 3 µm or less.

[18]

The film according to [16] or [17], wherein the inorganic filler (G) comprises at least one selected from the group consisting of silica, aluminum hydroxide, alumina, boehmite, boron nitride, aluminum nitride, magnesium oxide, and magnesium hydroxide.

[19]

The film according to any of [16] to [18], wherein a content of the inorganic filler (G) is 300 parts by mass or less based on 100 parts by mass of the compound (A).

[20]

The film according to any of [1] to [19], further comprising an imidazole compound (H).

[21]

The film according to [20], wherein a content of the imidazole compound (H) is 10 parts by mass or less based on 100 parts by mass of a total amount of the compound (A).

[22]

The film according to any of [1] to [21], having a thickness of 10 μm or more and 100 μm or less.

[23]

The film according to any of [1] to [22], for use in a pre-applied underfill material.

[24]

A laminate comprising:

a supporting material; and a layer comprising the film according to any of [1] to [23] laminated on the supporting material.

[25]

A semiconductor wafer with a film layer, comprising:

the semiconductor wafer; and the laminate according to [24] laminated on the semiconductor wafer, wherein the layer comprising the film is laminated on the semiconductor wafer.

[26]

A substrate for mounting a semiconductor with a film layer, comprising:

the substrate for mounting the semiconductor; and the laminate according to [24] laminated on the substrate for mounting the semiconductor, wherein the layer comprising the film is laminated on the substrate for mounting the semiconductor.

[27]

A semiconductor device comprising the semiconductor wafer with the film layer according to [25] and/or the substrate for mounting the semiconductor with the film layer according to [26].

Advantageous Effects of Invention

According to the present invention, a film that is excellent in balance of storage stability, flexibility, fluxability, curability, low void property, and melt viscosity, a laminate, a semiconductor wafer with a film layer, a substrate for mounting a semiconductor with a film layer, and a semiconductor device can be provided.

DESCRIPTION OF EMBODIMENT

An embodiment for carrying out the present invention (which will be simply referred to as the "present embodiment" hereinafter) will now be described. Note that the present embodiment below is given in order to illustrate the present invention, and the present invention is not limited only to the present embodiment.

[Film]

A film of the present embodiment comprises: a compound (A) containing at least one selected from the group consisting of a maleimide compound and a citraconimide compound (hereinafter, also simply referred to as a "compound (A)"; an organic peroxide (B) containing at least one selected from the group consisting of organic peroxides represented by the following formula (1) and the following formula (2) (hereinafter, also simply referred to as an "organic peroxide (B)"; and a hydroperoxide (C). Since the film of the present embodiment is configured in this way, it is excellent in balance of storage stability, flexibility, fluxability, curability, low void property, and melt viscosity. The film of the present embodiment has such performance and is therefore suitably used as a pre-applied underfill material for flip chip bonding of a chip.

(1)

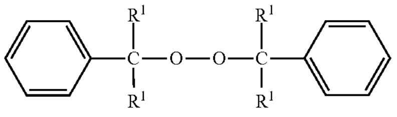

(In the formula (1), each $R^1$ independently represents a hydrogen atom, a methyl group, or an ethyl group.).

(2)

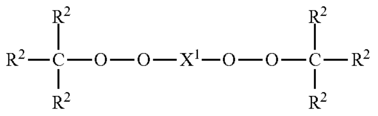

(In the formula (2), each $R^2$ independently represents a hydrogen atom, a methyl group, or an ethyl group, and $X^1$ represents a group represented by the following formula (3) or (4).).

(3)

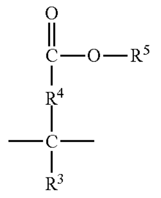

(In the formula (3), $R^3$ represents a hydrogen atom, a methyl group, or an ethyl group, $R^4$ represents an alkylene group having 1 or more and 3 or less carbon atoms, and $R^5$ represents a hydrogen atom or an alkyl group having 1 or more and 6 or less carbon atoms.).

(4)

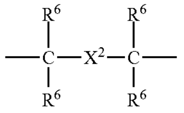

(In the formula (4), each $R^6$ independently represents a hydrogen atom, a methyl group, or an ethyl group, and $X^2$ represents a group represented by the following formulae (a) to (c).).

(a)

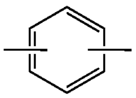

(b)

$$-C\equiv C-$$

-continued (c)

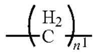

(In the formula (c), $n^1$ represents an integer of 1 or more and 5 or less.).

[Compound (A)]

From the viewpoint of insulation reliability and heat resistance, the film of the present embodiment comprises a compound (A) containing at least one selected from the group consisting of a maleimide compound and a citraconimide compound. The compound (A) is not particularly limited as long as it contains at least one selected from the group consisting of a maleimide group and a citraconimide group in the molecule. As for the compound (A), it is preferable that it does not exhibit reactivity with a flux component (F), which will be mentioned later. The compound (A) can be used alone as one kind, or can be used as a mixture of two or more kinds.

As for the compound (A) according to the present embodiment, it is preferable that it contain a maleimide compound from the viewpoints of obtaining excellent reactivity with a propenyl compound (E), which will be mentioned later, and of insulation reliability and heat resistance.

The maleimide compound is not particularly limited as long as it is a resin or compound having one or more maleimide groups in the molecule. The maleimide compound can be used as one kind, or can be used as a mixture of two or more kinds.

Specific examples of the maleimide compound include, but are not limited to, N-phenylmaleimide, N-hydroxyphenylmaleimide, bis(4-maleimidophenyl)methane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, polyphenylmethanemaleimide, a novolac-based maleimide compound, a biphenyl aralkyl-based maleimide compound, 2,2-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (5), a maleimide compound represented by the following formula (6), a maleimide compound represented by the following formula (7), a maleimide compound represented by the following formula (8), and a maleimide compound having a constituent unit represented by the following formula (9) and maleimide groups at both ends. The compound (A) may also be contained in the film according to the present embodiment in the form of, for example, a prepolymer obtained by polymerizing the maleimide compound or a prepolymer obtained by polymerizing the maleimide compound with another compound such as an amine compound.

(5)

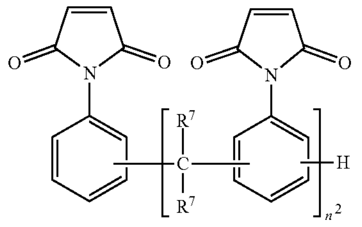

(In the formula (5), each $R^7$ independently represents a hydrogen atom or a methyl group, and n2 represents an integer of 1 or more, and preferably represents an integer of 1 or more and 10 or less.).

(6)

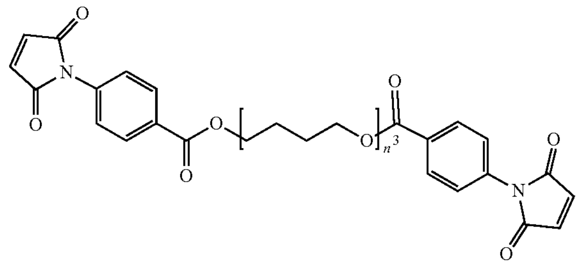

(In the formula (6), $n^3$ represents an integer of 1 or more and 30 or less.).

(7)

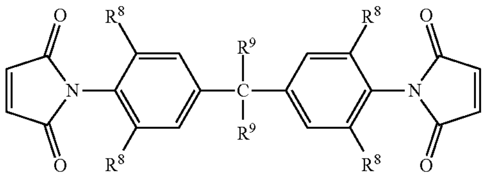

(In the formula (7), each $R^8$ independently represents a hydrogen atom, a methyl group, or an ethyl group, and each R" independently represents a hydrogen atom or a methyl group.).

(8)

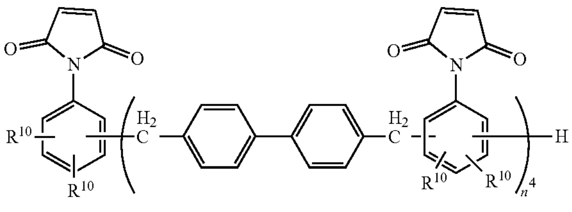

(In the formula (8), each $R^{10}$ independently represents a hydrogen atom, an alkyl group having 1 to 5 carbon atoms, or a phenyl group, and $n^4$ represents an integer of 1 or more and 10 or less.).

(9)

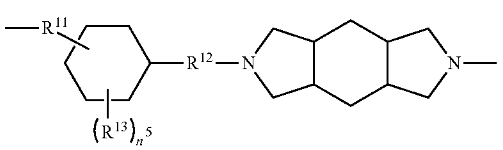

(In the formula (9), $R^{11}$ represents a linear or branched alkylene group having 1 or more and 16 or less carbon atoms, or a linear or branched alkenylene group having 2 or more and 16 or less carbon atoms, $R^{12}$ represents a linear or branched alkylene group having 1 or more and 16 or less carbon atoms, or a linear or branched alkenylene group having 2 or more and 16 or less carbon atoms, each $R^{13}$ independently represents a hydrogen atom, a linear or branched alkyl group having 1 or more and 16 or less carbon atoms, or a linear or branched alkenyl group having 2 or more and 16 or less carbon atoms, and n5 represents an integer of 1 or more and 10 or less.).

Among those mentioned above, from the viewpoint of solubility in an organic solvent, it is preferable that the compound (A) contain at least one selected from the group consisting of 2,2'-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the above formula (5), a maleimide compound represented by the above formula (6), a maleimide compound represented by the above formula (7), a maleimide compound represented by the above formula (8), and a bismaleimide compound having a constituent unit represented by the above formula (9) and maleimide groups at both ends, and it is more preferable that the compound (A) contain at least one selected from the group consisting of 2,2'-bis{4-(4-maleimidophenoxy)phenyl}propane, a maleimide compound represented by the above formula (5), a maleimide compound represented by the above formula (6), a maleimide compound represented by the above formula (7), a maleimide compound represented by the above formula (8), and a bismaleimide compound having a constituent unit represented by the above formula (9) and maleimide groups at both ends. Furthermore, from the viewpoint of particularly improving melt viscosity while maintaining good storage stability, flexibility, fluxability, curability, and low void property, it is still more preferable that the compound (A) contain a maleimide compound represented by the above formula (8) as the maleimide compound, and it is yet even more preferable that the compound (A) contain 2,2-bis{4-(4-maleimidophenoxy)phenyl}propane, a maleimide compound represented by the formula (6), a maleimide compound represented by the formula (7), and a maleimide compound represented by the formula (8).

As the maleimide compound, those commercially available may be used, and examples of 2,2'-bis{4-(4-maleimidophenoxy)phenyl}propane include, for example, BMI-80 (trade name) manufactured by Daiwa Kasei Industry Co., LTD. Examples of the maleimide compound represented by the formula (5) include, for example, BMI-2300 (trade name) manufactured by Daiwa Kasei Industry Co., LTD. Examples of the maleimide compound represented by the formula (6) include, for example, BMI-1000P (trade name, $n_3$=14 (average) in the formula (6)) manufactured by K•I Chemical Industry Co., LTD., BMI-650P (trade name, $n_3$=9

(average) in the formula (6)) manufactured by K•I Chemical Industry Co., LTD., BMI-250P (trade name, $n_3$=3 to 8 (average) in the formula (6)) manufactured by K•I Chemical Industry Co., LTD., and CUA-4 (trade name, $n_3$=1 in the formula (6)) manufactured by K•I Chemical Industry Co., LTD. Examples of the maleimide compound represented by the formula (7) include, for example, BMI-70 (trade name; bis-(3-ethyl-5-methyl-4-maleimidophenyl)methane) manufactured by K•I Chemical Industry Co., LTD. Examples of the maleimide compound represented by the formula (8) include, for example, MIR-3000-70MT (trade name, a mixture wherein all $R^4$ are hydrogen atoms and $n^5$ is 1 to 10 in the formula (8)) manufactured by Nippon Kayaku Co., Ltd. Examples of the maleimide compound having a constituent unit represented by the formula (9) and maleimide groups at both ends include, for example, MIZ-001 (trade name) manufactured by Nippon Kayaku Co., Ltd.

The citraconimide compound is not particularly limited, but examples thereof include, for example, o-phenylenebiscitraconimide, m-phenylenebiscitraconimide, p-phenylenebiscitraconimide, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, 1,3-xylylenebis(citraconimide), N-[3-bis(trimethylsilyl)amino-1-propyl]citraconimide, N-[3-bis(triethylsilyl)amino-1-propyl]citraconimide, N-[3-bis(triphenylsilyl)amino-1-propyl]citraconimide, N,N'-(m-phenylenedimethylene)dicitraconimide, and N-[3-(methylidenesuccinimidomethyl)benzyl]citraconimide. The citraconimide compound can be used as one kind, or can be used as a mixture of two or more kinds.

In the film of the present embodiment, the content of the compound (A) is not particularly limited, but from the viewpoint of ensuring the insulation reliability and heat resistance of the package after mounting, it is preferably contained in the film in an amount of 10% by mass or more and 60% by mass or less, more preferably contained in an amount of 15% by mass or more and 50% by mass or less, and still more preferably contained in an amount of 20% by mass or more and 40% by mass or less.

[Organic Peroxide (B)]

From the viewpoint of imparting curability at the time of mounting, the film of the present embodiment comprises an organic peroxide (B) containing at least one selected from the group consisting of organic peroxides represented by the following formula (1) and the following formula (2). The organic peroxide (B) can be used alone as one kind, or can be used as a mixture of two or more kinds.

(1)

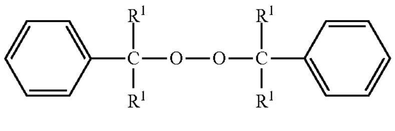

(In the formula (1), each $R^1$ independently represents a hydrogen atom, a methyl group or an ethyl group.).

(2)

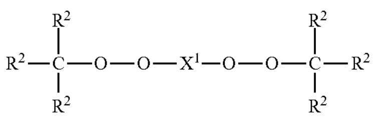

(In the formula (2), each $R^2$ independently represents a hydrogen atom, a methyl group or an ethyl group, and $X^1$ represents a group represented by the following formula (3) or (4).).

(3)

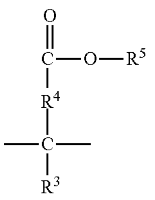

(In the formula (3), $R^3$ represents a hydrogen atom, a methyl group or an ethyl group, $R^4$ represents an alkylene group having 1 or more and 3 or less carbon atoms, and $R^5$ represents a hydrogen atom or an alkyl group having 1 or more and 6 or less carbon atoms.).

(4)

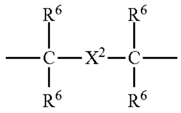

(In the formula (4), each $R^6$ independently represents a hydrogen atom, a methyl group or an ethyl group, and $X^2$ represents a group represented by the following formulae (a) to (c).).

(a)

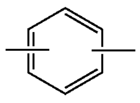

(b)

$—C\equiv C—$ (c)

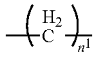

(In the formula (c), $n^1$ represents an integer of 1 or more and 5 or less.).

In the present embodiment, from the viewpoints of solubility in an organic solvent and of suppressing volatilization or thermal decomposition during film fabrication, it is preferable that the organic peroxide (B) contain at least one selected from the group consisting of dicumyl peroxide, n-butyl-4,4-di-(tert-butylperoxy)valerate, di(2-tert-butylperoxyisopropyl)benzene, 2,5-dimethyl-2,5-bis(tert-butylperoxy)hexyne-3, and 2,5-dimethyl-2,5-bis(tert-butylperoxy) hexane.

In the film of the present embodiment, the content of the organic peroxide (B) is not particularly limited, but from the viewpoint of reducing volatile portions at the time of mounting, it is preferably contained in an amount of 0.01 parts by mass or more and 15 parts by mass or less, more preferably contained in an amount of 0.05 parts by mass or more and 10 parts by mass or less, and still more preferably contained in an amount of 0.1 parts by mass or more and 8 parts by mass or less, based on 100 parts by mass of the compound (A).

[Hydroperoxide (C)]

From the viewpoint of imparting curability at the time of mounting, the film of the present embodiment may comprise a hydroperoxide (C). The hydroperoxide (C) is not particularly limited as long as it is obtained by replacing a hydrogen atom of hydrogen peroxide with an organic group. In the present embodiment, the hydroperoxide (C) can be used alone as one kind, or can be used as a mixture of two or more kinds.

Examples of the hydroperoxide (C) include, for example, a hydroperoxide represented by the following formula (10), a hydroperoxide represented by the following formula (11), and a hydroperoxide represented by the following formula (12).

(10)

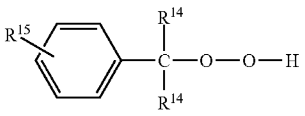

(In the formula (10), each $R^{14}$ independently represents a hydrogen atom or a methyl group, and $R^{15}$ represents a hydrogen atom, a methyl group, an isopropyl group, or a tert-butyl group.).

(11)

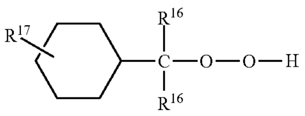

(In the formula (11), each $R^{16}$ independently represents a hydrogen atom or a methyl group, and $R^{17}$ represents a hydrogen atom, a methyl group, an isopropyl group, or a tert-butyl group.).

(12)

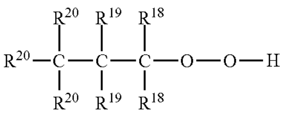

(In the formula (12), each $R^{18}$ independently represents a hydrogen atom or a methyl group, each $R^{19}$ independently represents a hydrogen atom or a methyl group, and each $R^{20}$ independently represents a hydrogen atom or a methyl group.).

The molecular weight of the hydroperoxide (C) is not particularly limited, but from the viewpoint of reducing volatile portions at the time of mounting, it is preferably 100 or more, and is more preferably 130 or more. From the same viewpoint, it is preferable that the hydroperoxide (C) contain at least one selected from the group consisting of p-menthane hydroperoxide, diisopropylbenzene hydroperoxide, cumene hydroperoxide, 1,1,3,3-tetramethylbutyl hydroperoxide, and tert-amyl hydroperoxide.

In the film of the present embodiment, the content of the hydroperoxide (C) is not particularly limited, but from the viewpoint of achieving both curability at the time of mounting and reduction in volatile portions, it is preferably contained in an amount of 10 parts by mass or less, more preferably contained in an amount of 0.01 parts by mass or more and 10 parts by mass or less, and still more preferably contained in an amount of 0.1 parts by mass or more and 8 parts by mass or less, based on 100 parts by mass of the compound (A).

[Benzoxazine Compound (D)]

From the viewpoint of imparting adhesiveness, the film of the present embodiment may comprise a benzoxazine compound (D). The benzoxazine compound is not particularly limited as long as it has an oxazine ring as the basic skeleton. In the present embodiment, the benzoxazine compound also encompasses compounds having a polycyclic oxazine skeleton, such as naphthoxazine compounds. In the present embodiment, the benzoxazine compound (D) can be used alone as one kind, or can be used as a mixture of two or more kinds. In the present embodiment, it is preferable that the benzoxazine compound (D) be one represented by the following formula (13), the following formula (14), the following formula (15), and the following formula (16).

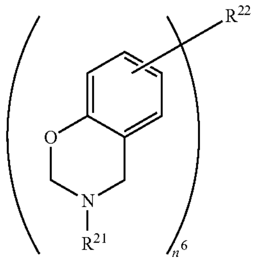

(13)

(In the formula (13), each $R^{23}$ independently represents an aryl group, an aralkyl group, an alkenyl group, an alkyl group, or a cycloalkyl group, $R^{24}$ represents a hydrogen atom, an aryl group, an aralkyl group, an alkenyl group, an alkyl group, a cycloalkyl group, or a monovalent to tetravalent organic group represented by the following general formulae (d) to (w), and $n^5$ represents an integer of 1 to 4.).

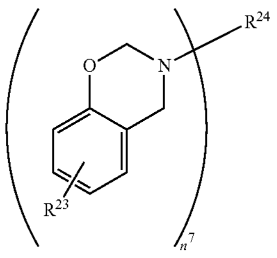

(14)

(In the formula (14), each $R^{25}$ independently represents a hydrogen atom, an aryl group, an aralkyl group, an alkenyl group, an alkyl group, or a cycloalkyl group, $R^{26}$ represents an aryl group, an aralkyl group, an alkenyl group, an alkyl group, a cycloalkyl group, or a monovalent to tetravalent organic group represented by the following general formulae (d) to (r), and $n^6$ represents an integer of 1 to 4.).

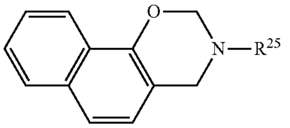

(15)

(In the formula (15), $R^{27}$ represents an alkyl group, a cycloalkyl group, or a phenyl group optionally having a substituent.).

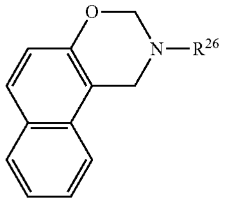

(16)

(In the formula (16), $R^{28}$ represents an alkyl group, a cycloalkyl group, or a phenyl group optionally having a substituent.).

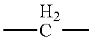

(d)

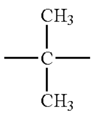

(e)

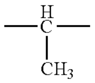

(f)

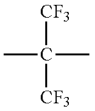

(g)

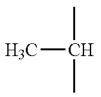

(h)

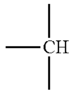

(i)

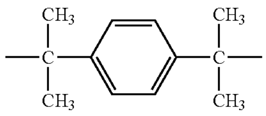

(j)

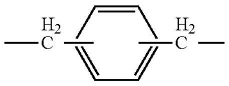

(k)

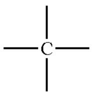

(l)

-continued (m)

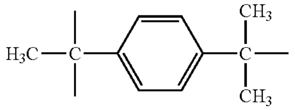

(n)

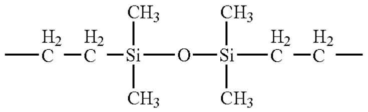

(o)

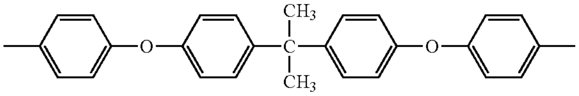

(p)

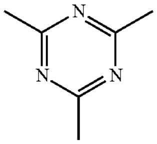

(q)

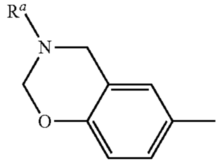

(r)

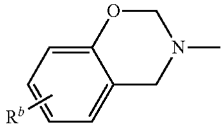

(s)

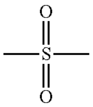

(t)

—O—

(u)

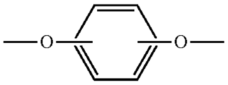

(v)

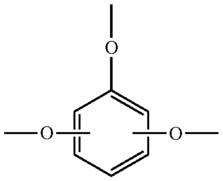

(w)

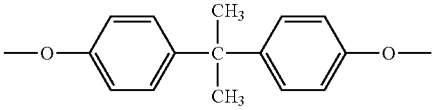

(In the formulae (d) to (w), $R^a$ represents an aryl group, an aralkyl group, an alkenyl group, an alkyl group, or a cycloalkyl group, $R^b$ represents a hydrogen atom, an aryl group, an aralkyl group, an alkenyl group, an alkyl group, or a cycloalkyl group.).

In the present embodiment, from the viewpoint of flame retardancy and heat resistance, it is preferable that the benzoxazine compound (D) contain at least one selected from the group consisting of compounds represented by the following formula (17) and the following formula (18).

(17)

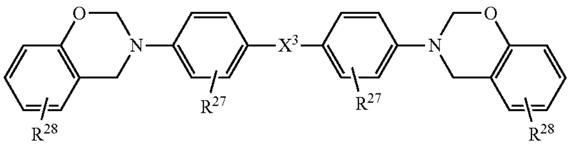

(In the formula (17), each $R^{29}$ independently represents a hydrogen atom, an aryl group, an aralkyl group, an alkenyl group, an alkyl group, or a cycloalkyl group, each $R^{30}$ independently represents a hydrogen atom, an aryl group, an aralkyl group, an alkenyl group, an alkyl group, or a cycloalkyl group, and $X^3$ represents an alkylene group, a group represented by the following formula (19), a group represented by the formula "—$SO_2$—", a group represented by the formula "—CO—", an oxygen atom, or a single bond.).

(18)

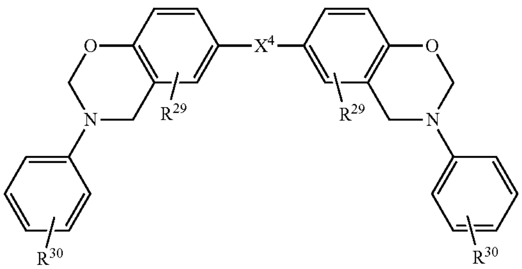

(In the formula (18), each $R^{31}$ independently represents a hydrogen atom, an aryl group, an aralkyl group, an alkenyl group, an alkyl group, or a cycloalkyl group, each $R^{32}$ independently represents a hydrogen atom, an aryl group, an aralkyl group, an alkenyl group, an alkyl group, or a cycloalkyl group, and $X^4$ represents an alkylene group, a group represented by the following formula (19), a group represented by the formula "—$SO_2$—", a group represented by the formula "—CO—", an oxygen atom, or a single bond.).

(19)

$$-O-(Y)_{n^8}-O-$$

(In the formula (19), Y is an alkylene group or a hydrocarbon group having 6 or more and 30 or less carbon atoms and having an aromatic ring, and $n^7$ represents an integer of 0 or more, and preferably represents an integer of 0 or more and 5 or less.).

In the present embodiment, from the viewpoint of solubility in an organic solvent, it is preferable that the benzoxazine compound (D) contain at least one selected from the group consisting of a compound represented by the following formula (20), a compound represented by the following formula (21), a compound represented by the following formula (22), a compound represented by the following formula (23), a compound represented by the following formula (24), and a compound represented by the following formula (25).

(20)

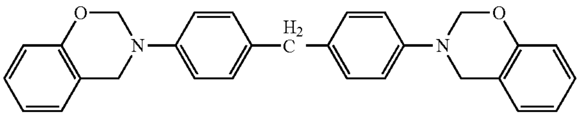

(21)

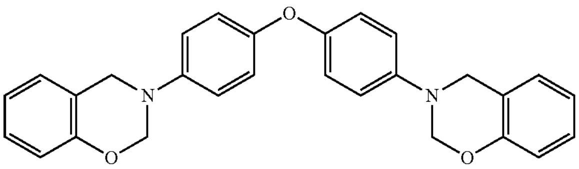

(22)

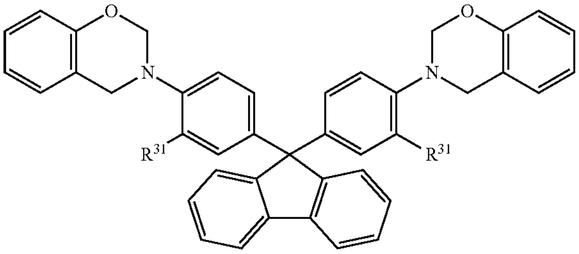

(In the formula (22), each $R^{33}$ independently represents a hydrogen atom or a hydrocarbon group having 1 to 4 carbon atoms.)

(23)

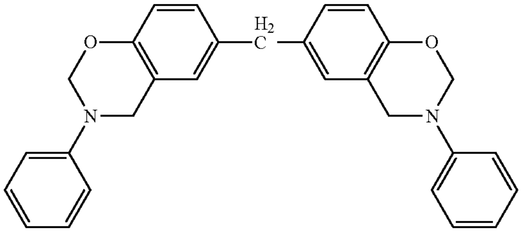

(24)

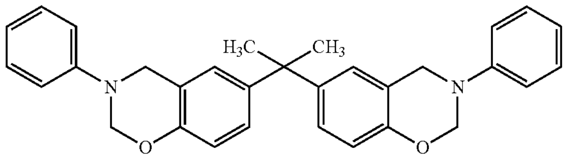

(25)

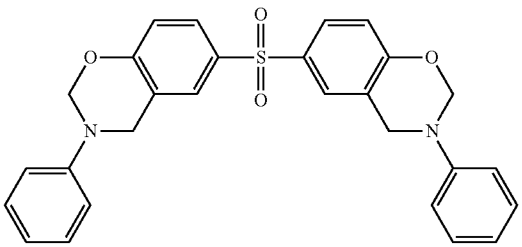

Note that, in the present embodiment, oligomers produced by polymerizing monomers or the like may be contained in the benzoxazine compound (D).

In the film of the present embodiment, the content of the benzoxazine compound (D) is not particularly limited, but from the viewpoint of achieving both adhesiveness and flexibility of the film, it is preferably contained in an amount of 5 parts by mass or more and 60 parts by mass or less, more preferably contained in an amount of 10 parts by mass or more and 55 parts by mass or less, and still more preferably contained in an amount of 15 parts by mass or more and 50 parts by mass or less, based on 100 parts by mass of the compound (A).

[Propenyl Compound (E)]

From the viewpoint of imparting adhesiveness as well as curability at the time of mounting, the film of the present embodiment may comprise a propenyl compound (E). The propenyl compound (E) is not particularly limited as long as it contains a propenyl group. In the present embodiment, the propenyl compound (E) can be used alone as one kind, or can be used as a mixture of two or more kinds. In the present embodiment, it is preferable that the propenyl compound (E) contain a constituent unit represented by the following formula (26) at an end of the molecule.

(26)

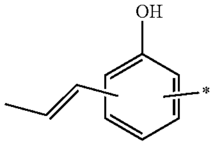

In the formula (26), —* represents a bonding hand and it is bonded to the main chain of the polymer.

Since the propenyl compound (E) has a highly reactive propenyl group at its end, a reaction between propenyl groups and a reaction of a maleimide group and a citraconimide group with a propenyl group are likely to occur during the curing process. As a result, the crosslinking density of the resulting cured product is increased, low void property is obtained, and furthermore, heat resistance (glass transition temperature) is also improved. In addition, since it has a polar group, chip adhesiveness between the adherend, such as a chip and substrate, and the underfill material is also improved.

The polymer, which is the main chain of the propenyl compound (E), is not particularly limited as long as it contains an alkenyl group and a hydroxy group.

The alkenyl group is not particularly limited, but examples thereof include, for example, a vinyl group, a (meth)allyl group, a propenyl group, a butenyl group, and a hexenyl group. Among the above, a propenyl group is preferable.

The polymer is not particularly limited, but examples thereof include, for example, bisphenol A, tetramethyl bisphenol A, diallyl bisphenol A, biphenol, bisphenol F, diallyl bisphenol F, triphenylmethane-based phenol, tetrakisphenol, novolac-based phenol, cresol novolac resins, and polymers having an alkenyl group in the phenol ring, such as phenol with a biphenyl aralkyl skeleton (biphenyl-based phenol). These polymers may have a substituent. Also, these polymers may be used as one kind, or in arbitrary combination of two or more kinds.

Examples of such a substituent include a halogen atom and a linear, branched, or cyclic hydrocarbon group. It is preferable that the linear, branched, or cyclic hydrocarbon group have an alkenyl group as a substituent. The alkenyl group is as described above.

Examples of the halogen atom include a fluorine atom, a chlorine atom, a bromine atom, and an iodine atom.

The linear or branched hydrocarbon group is not particularly limited, but examples thereof include, for example, a methyl group, an ethyl group, a propyl group, an isopropyl group, an n-butyl group, an s-butyl group, an isobutyl group, a t-butyl group, an n-pentyl group, an isopentyl group, a t-pentyl group, an n-hexyl group, an isohexyl group, an s-hexyl group, and a t-hexyl group.

The cyclic hydrocarbon group is not particularly limited, but examples thereof include, for example, an aliphatic cyclic hydrocarbon group and an aromatic hydrocarbon group. Examples of the aliphatic cyclic hydrocarbon group include, for example, a monocyclic aliphatic hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic hydrocarbon group such as a bicyclo[2.2.2]octanyl group, a tricyclo[5.2.1.02,6]decanyl group, a tricyclo[3.3.1.13,7]decanyl group, a tetracyclo [6.2.1.13,6.02,7]dodecanyl group, and an adamantyl group. Examples of the aromatic hydrocarbon group include a group obtained by removing one hydrogen atom from an aromatic hydrocarbon ring such as benzene, biphenyl, fluorene, naphthalene, anthracene, and phenanthrene.

In the propenyl compound (E), from the viewpoint of preventing voids due to volatilization of the propenyl compound (E) during the flip chip bonding, the mass average molecular weight of the propenyl compound (E) is, not particularly limited to, preferably 300 or more and 10,000 or less, more preferably 400 or more and 7,000 or less, and still more preferably 1000 or more and 3000 or less in terms of polystyrene by the gel permeation chromatography (GPC) method.

It is preferable that the propenyl compound (E) include a resin that is represented by the following formula (26-1) and in which 20% or more of the alkenyl groups in the molecule are propenyl groups. When the film of the present embodiment comprises such a propenyl compound (E), excellent heat resistance can be obtained.

(26-1)

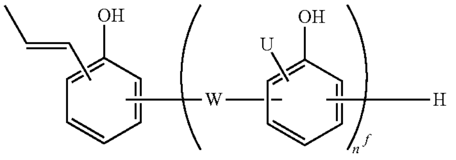

(In the formula (26-1), each W independently represents a hydrocarbon group having 6 to 15 carbon atoms and optionally having a substituent. Each U independently represents a hydrogen atom or an alkenyl group having 2 to 6 carbon atoms. $n^1$ represents the number of repetitions, and its average value is a real number of 1 to 20.)

In the formula (26-1), each W independently represents a hydrocarbon group having 6 to 15 carbon atoms and optionally having a substituent. It is preferable that the substituent in W contain an aromatic ring, and in this case, it is preferable that the propenyl compound (E) be a resin that is represented by the formula (26-2), which will be mentioned later, and in which 20% or more of the alkenyl groups in the molecule are propenyl groups.

In addition, W in the formula (26-1) is preferably an aromatic hydrocarbon group, and is more preferably an aromatic hydrocarbon group having 10 to 15 carbon atoms. W is not particularly limited, but for example, mention may be made of the following structures. These structures may be used as one kind, or in arbitrary combination of two or more kinds.

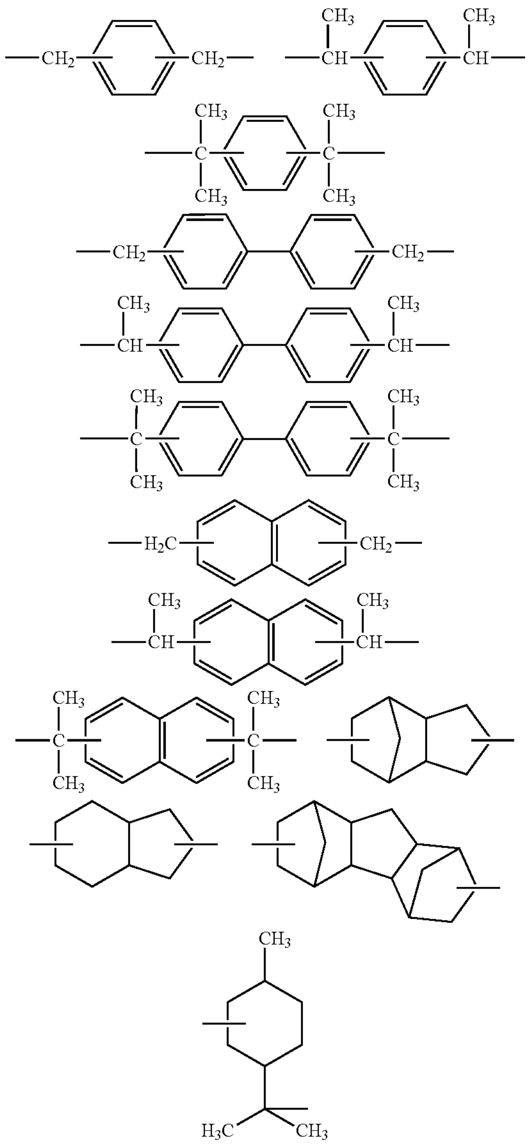

Among the above, it is preferable for W to have an alkyl-based biphenyl skeleton from the standpoint of heat resistance.

In the formula (26-1), the phrase "20% or more of the alkenyl groups in the molecule are propenyl groups" refers to that, based on the total of U and the terminal propenyl group, 20% or more of them are propenyl groups. In the formula (26-1), it is preferable that 40% or more of the alkenyl groups in the molecule be propenyl groups, and it is more preferable that 60% or more of them be propenyl groups. The upper limit is not particularly limited, but is 100%. When the alkenyl groups in the molecule are in the above range, excellent curability can be obtained.

In the formula (26-1), each U other than the propenyl group independently represents a hydrogen atom or an alkenyl group having 2 to 6 carbon atoms. Examples of the alkenyl group having 2 to 6 carbon atoms include a vinyl group, a (meth)allyl group, a butenyl group, and a hexenyl group. U other than the propenyl group is preferably a hydrogen atom from the standpoint that the curability can be controlled suitably.

In the formula (26-1), $n^1$ represents the number of repetitions, and its average value is a real number of 1 to 20. From the standpoint that the curability can be suitably controlled, it is preferable that the average value of $n^1$ be a real number of 1 to 10, and it is more preferable that the average value thereof be a real number of 1 to 6.

When W in the formula (26-1) contains an aromatic ring as the substituent, it is preferable that the propenyl compound (E) be a resin that is represented by the following formula (26-2) and in which 20% or more of the alkenyl groups in the molecule are propenyl groups.

(26-2)

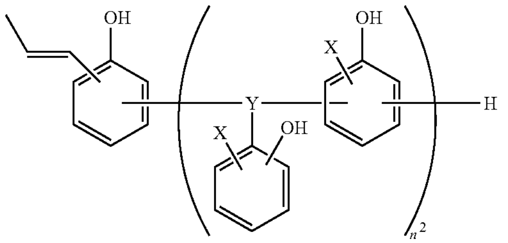

In the formula (26-2), each Y independently represents a hydrocarbon group having 1 to 6 carbon atoms. Each X independently represents a hydrogen atom or an alkenyl group having 2 to 6 carbon atoms. $n^2$ represents the number of repetitions, and its average value is a real number of 1 to 20.

In the formula (26-2), each Y independently represents a divalent hydrocarbon group having 1 to 6 carbon atoms. Y is a structure in which one of the hydrogen atoms in a divalent hydrocarbon group having 1 to 6 carbon atoms is replaced with a phenol ring having an alkenyl group. Y is not particularly limited, but it is preferable that it be a linear, branched, or cyclic divalent hydrocarbon group having 1 to 6 carbon atoms.

The linear hydrocarbon group is not particularly limited, but examples thereof include, for example, a methylene group, an ethylene group, a propylene group, a butylene group, a pentylene group, and a hexylene group. Examples of the branched hydrocarbon group include, for example, an alkylmethylene group such as $—C(CH_3)_2—$, $—CH(CH_3)—$, $—CH(CH_2CH_3)—$, $—C(CH_3)(CH_2CH_3)—$, $—C(CH_3)(CH_2CH_2CH_3)—$, and $—C(CH_2CH_3)_2—$; and an alkylethylene group such as $—CH(CH_3)CH_2—$, $—CH(CH_3)CH(CH_3)—$, $—C(CH_3)_2CH_2—$, $—CH(CH_2CH_3)CH_2—$, and $—C(CH_2CH_3)_2—CH_2—$.

The cyclic hydrocarbon group is not particularly limited, but examples thereof include, for example, a cyclopropylene group, a cyclobutylene group, a cyclopentylene group, and a cyclohexylene group.

These hydrocarbon groups may be used as one kind, or in arbitrary combination of two or more kinds.

Among the above, Y is preferably a methylene group from the standpoint that good compatibility with another resin such as a radical polymerizable resin, which will be mentioned later, or the compound (B) can be obtained.

In the formula (26-2), the phrase "20% or more of the alkenyl groups in the molecule are propenyl groups" refers to that, based on the total of X and the terminal propenyl group, 20% or more of them are propenyl groups. In the formula (26-2), it is preferable that 40% or more of the alkenyl groups in the molecule be propenyl groups, and it is more preferable that 60% or more of them be propenyl groups. The upper limit is not particularly limited, but is 100. When the alkenyl groups in the molecule are in the range described above, excellent curability can be obtained.

In the formula (26-2), each X other than the propenyl group independently represents a hydrogen atom or an alkenyl group having 2 to 6 carbon atoms. The alkenyl group having 2 to 6 carbon atoms is as described above. From the standpoint that the curability can be controlled suitably, U other than the propenyl group is preferably a hydrogen atom.

In the formula (26-2), $n^2$ represents the number of repetitions, and its average value is a real number of 1 to 20. From the standpoint that the curability can be suitably controlled, it is preferable that the average value of $n^2$ be a real number of 1 to 10, and it is more preferable that the average value thereof be a real number of 1 to 6.

The method for producing the propenyl compound (E) represented by the formula (26-1) or the formula (26-2) according to the present embodiment is not particularly limited and it can be produced by a publicly known method.

Examples of the production method include, for example, a method in which a phenolic resin is used as a raw material. The phenolic resin is not particularly limited, but examples thereof include bisphenol A, tetramethyl bisphenol A, diallyl bisphenol A, biphenol, bisphenol F, diallyl bisphenol F, triphenylmethane-based phenol, tetrakisphenol, novolac-based phenol, cresol novolac resins, phenol with a biphenyl aralkyl skeleton (biphenyl-based phenol), and phenol with a triphenylmethane skeleton (triphenylmethane-based phenol).

In the production method, the hydroxyl group in these phenolic resins is allylated to synthesize an allyl ether body, and then the obtained allyl ether group is subjected to a transfer reaction to a propenyl ether group, thereby obtaining the propenyl compound (E). Alternatively, the propenyl compound (E) can also be obtained by subjecting the resulting allyl ether group to a Claisen transfer reaction to obtain an allylated phenol, followed by a transfer reaction of the allyl group to a propenyl group according to a publicly known method.

As the propenyl compound (E), a propenyl group containing resin containing a structure represented by the following formula (26-3) and a propenyl group containing resin containing the following formula (26-4) are preferable. As such a propenyl compound (E), a commercially available product may be used. Examples of the propenyl group containing resin containing a structure represented by the formula (26-3) include, for example, BPN01-S (trade name, mass average molecular weight: 1830) manufactured by Gun Ei Chemical Industry Co., Ltd., and examples of the propenyl group containing resin containing the following formula (26-4) include TPMP01 (trade name, mass average molecular weight: 2371) manufactured by Gun Ei Chemical Industry Co., Ltd.

(26-3)

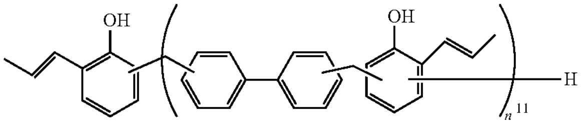

(The above formula (26-3) is a mixture wherein $n^{11}$ is 1 to 10.)

(26-4)

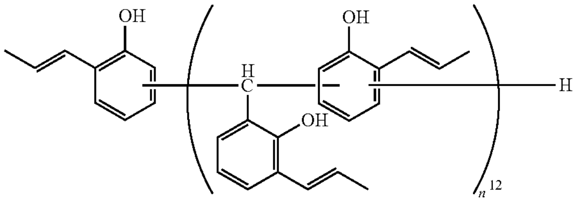

(The formula (26-4) is a mixture wherein $n^{12}$ is 1 to 10.)

In the film of the present embodiment, the content of the propenyl compound (E) is not particularly limited, but from the viewpoint of achieving both flexibility and adhesiveness of the film, it is preferably contained in an amount of 5 parts by mass or more and 50 parts by mass or less based on 100 parts by mass of the compound (A).

[Flux Component (F)]

It is preferable that the film of the present embodiment further comprise a flux component (F) in order to exhibit fluxability during the flip chip bonding. The flux component (F) is not particularly limited as long as it is an organic compound having one or more acid sites in the molecule. As the acid site, for example, a phosphoric acid group, a phenolic hydroxy group, a carboxyl group, and a sulfonic acid group are preferable, and a phenolic hydroxy group or a carboxyl group is more preferable from the viewpoint of more effectively preventing migration of a metal constituting the joint, such as solder and copper, and corrosion in a semiconductor device using the film of the present embodiment as a pre-applied underfill material. The flux component (F) can be used alone as one kind, or can be used in an appropriate mixture of two or more kinds.

In order to sufficiently remove the oxidized layer from the joint, the flux component (F) preferably has an acid dissociation constant pKa of, although not particularly limited, 3.8 or more and 15.0 or less, and from the viewpoint of achieving both storage stability and fluxability of the varnish and the resin laminate, more preferably has an acid dissociation constant pKa of 4.0 or more and 14.0 or less.

Although the flux component (F) in the film of the present embodiment is not particularly limited, from the viewpoint of preventing the flux component (F) from being volatilized before the fluxability is exhibited during the flip chip bonding, that is, from being volatilized before the oxidized layer is removed from the joint, the molecular weight thereof is preferably 200 or more, and more preferably 250 or more. In order that the flux component (F) has mobility as an acid and sufficient fluxability is obtained, the molecular weight thereof is preferably 8000 or less, more preferably 1000 or less, and still more preferably 500 or less.

The flux component (F) is not particularly limited, but examples thereof include, for example, abietic acid, neoabietic acid, dehydroabietic acid, pimaric acid, isopimaric acid, palustric acid, diphenolic acid, dihydroabietic acid, tetrahydroabietic acid, a rosin acid-modified resin such as rosin-modified maleic acid resin, N,N'-bis(salicylidene)-1,2-propanediamine, N,N'-bis(salicylidene)-1,3-propanediamine, and phenolphthalin. These flux components (F) are preferable from the standpoint of excellent solvent solubility and storage stability.

Among the above, from the viewpoint of preventing deactivation caused by the compound (A), dehydroabietic acid, diphenolic acid, dihydroabietic acid, tetrahydroabietic acid, a rosin acid-modified resin such as rosin-modified maleic acid resin, N,N'-bis(salicylidene)-1,2-propanediamine, and N,N'-bis(salicylidene)-1,3-propanediamine are more preferable. Since dehydroabietic acid, dihydroabietic acid, a rosin acid-modified resin such as rosin-modified maleic acid resin, N,N'-bis(salicylidene)-1,2-propanediamine, and N,N'-bis(salicylidene)-1,3-propanediamine have relatively low reactivity, they hardly react with the propenyl containing resin (A) according to the present embodiment and the radical polymerizable resin or compound (B) according to the present embodiment, and are thus still more preferable from the viewpoint of maintaining sufficient fluxability necessary for removing the oxidized layer.

As the flux component (F), those commercially available may be used, and examples of the rosin-modified maleic acid resin include, but are not limited to, MALKYD No. 32 (manufactured by Arakawa Chemical Industries, Ltd.).

In the film of the present embodiment, the content of the flux component (F) is not particularly limited, but from the viewpoints of insulation reliability and of ensuring sufficient fluxability at the time of mounting, it is preferably contained in an amount of 5 parts by mass or more and 70 parts by mass or less, more preferably contained in an amount of 10 parts by mass or more and 65 parts by mass or less, and still more preferably contained in an amount of 15 parts by mass or more and 60 parts by mass or less, based on 100 parts by mass of the compound (A).

[Inorganic Filler (G)]

It is preferable that the film of the present embodiment further comprise an inorganic filler (G) in order to improve burning resistance, to improve thermal conductivity, and to reduce the thermal expansion coefficient. By using an inorganic filler, the burning resistance and thermal conductivity of the film and the like can be improved, and the thermal expansion coefficient can be reduced.

Although the average particle diameter of the inorganic filler (G) is not particularly limited, it is preferably 3 μm or less and more preferably 1 μm or less from the viewpoint of coping with narrower electrode pitch arranged on the chip and narrower gap between the electrodes when the film of the present embodiment is used as a pre-applied underfill material. The lower limit value of the average particle diameter is not particularly limited, but it is, for example, 10 nm. Note that, in the present embodiment, the "average particle diameter" of the inorganic filler (G) means the median diameter of the inorganic filler (G). Here, the median diameter means a certain particle diameter such that, when the particle size distribution of powder is divided into two parts based on that particle diameter, the volume of particles on the side of larger particle diameter and the volume of particles on the side of smaller particle diameter each account for 50% of the entire powder. The average particle diameter (median diameter) of the inorganic filler (G) is measured according to the wet laser diffraction scattering method.

The inorganic filler (G) is not particularly limited, but examples thereof include, for example, a silica such as natural silica, fused silica, amorphous silica, and hollow silica; an aluminum compound such as boehmite, aluminum hydroxide, alumina, and aluminum nitride; a magnesium compound such as magnesium oxide and magnesium hydroxide; a calcium compound such as calcium carbonate and calcium sulfate; a molybdenum compound such as molybdenum oxide and zinc molybdate; boron nitride;

barium sulfate; a talc such as natural talc and calcined talc; mica; and a glass such as short fibrous glass, spherical glass, and fine powder glass (for example, E glass, T glass, D glass). In addition, when it is desired to impart electrical conductivity or anisotropic electrical conductivity to the film of the present embodiment, metal particles of, for example, gold, silver, nickel, copper, tin alloy, and palladium may be used as the inorganic filler (G).

Among the above, from the viewpoint of improving the burning resistance and reducing the thermal expansion coefficient of the film of the present embodiment, it is preferable for the film of the present embodiment to contain at least one selected from the group consisting of silica, aluminum hydroxide, alumina, boehmite, boron nitride, aluminum nitride, magnesium oxide, and magnesium hydroxide as the inorganic filler (G), and silica, alumina, and boron nitride are more preferable. Among the above, silica is still more preferable. Examples of the silica include, for example, SFP-120MC (trade name) and SFP-130MC (trade name) manufactured by Denka Company Limited; and 0.3 μm SX-CM1 (trade name), 0.3 μm SX-EM1 (trade name), 0.3 μm SV-EM1 (trade name), SC1050-MLQ (trade name), SC2050-MNU (trade name), SC2050-MTX (trade name), 2.2 μm SC6103-SQ (trade name), SE2053-SQ (trade name), Y50SZ-AM1 (trade name), YA050C-MJE (trade name), YA050C-MJF (trade name), and YA050C-MJA manufactured by Admatechs Company Limited.

These inorganic fillers (G) can be used alone as one kind, or can be used in an appropriate mixture of two or more kinds.

As the inorganic filler (G), those surface-treated with a silane coupling agent may be used.

The silane coupling agent is not particularly limited as long as it is a silane coupling agent generally used for the surface treatment of inorganic matters. Examples thereof include, for example, a vinylsilane-based silane coupling agent such as vinyltrimethoxysilane and γ-methacryloxypropyltrimethoxysilane; a phenylaminosilane-based silane coupling agent such as N-phenyl-3-aminopropyltrimethoxysilane; a phenylsilane-based silane coupling agent such as trimethoxyphenylsilane; and an imidazolesilane-based silane coupling agent. These silane coupling agents can be used alone as one kind, or can be used in an appropriate mixture of two or more kinds.

In the film of the present embodiment, the content of the inorganic filler (G) is not particularly limited, but from the viewpoint of achieving both improvement in the flame retardancy and reduction in the thermal expansion coefficient of the film, it is preferably contained in an amount of 300 parts by mass or less, more preferably contained in an amount of 20 parts by mass or more and 300 parts by mass or less, and still more preferably contained in an amount of 50 parts by mass or more and 250 parts by mass or less, based on 100 parts by mass of the compound (A).

[Imidazole Compound (H)]

From the viewpoint of imparting curability at the time of mounting, the film of the present embodiment may comprise an imidazole compound (H). The imidazole compound (H) is not particularly limited as long as it has an imidazole group. The imidazole compound (H) can be used alone as one kind, or can be used as a mixture of two or more kinds.

In the present embodiment, it is preferable that the imidazole compound (H) include one represented by the following formula (h1).

(h1)

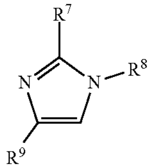

(In the formula (h1), $R^7$ represents a methyl group or an ethyl group, $R^8$ represents a hydrogen atom, an alkyl group having 1 or more and 5 or less carbon atoms, an aryl group, or an aralkyl group, and $R^9$ represents a hydrogen atom, an alkyl group having 1 or more and 5 or less carbon atoms, an aryl group, or an aralkyl group.)

In the present embodiment, from the viewpoints of solubility in an organic solvent and of reducing volatile portions at the time of mounting, it is preferable that the imidazole compound (H) be an imidazole compound represented by the following formula (h2).

(h2)

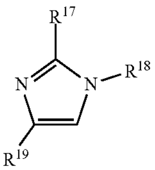

(In the formula (h2), $R^{17}$ represents a methyl group or an ethyl group, $R^{18}$ represents a hydrogen atom, an alkyl group having 1 or more and 5 or less carbon atoms, an aryl group, or an aralkyl group, and $R^{19}$ represents a hydrogen atom or a methyl group.)

In the present embodiment, from the viewpoint of ensuring mobility of the molecule at the time of mounting, it is preferable that the imidazole compound (H) be an imidazole compound represented by the following formula (h3).

(h3)

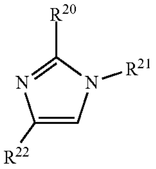

(In the formula (h3), $R^{20}$ represents a methyl group or an ethyl group, $R^{21}$ represents a hydrogen atom, a methyl group, an ethyl group, or a benzyl group, and $R^{22}$ represents a hydrogen atom or a methyl group.)

In the present embodiment, from the viewpoint of achieving both excellent fluxability and solubility in an organic solvent, it is preferable that the imidazole compound (H) contain at least one selected from the group consisting of 1-benzyl-2-methylimidazole, 1,2-dimethylimidazole, and 2-ethyl-4-methylimidazole.

In the film of the present embodiment, the content of the imidazole compound (H) is not particularly limited, but from the viewpoint of achieving both storage stability of the varnish and curability at the time of mounting, it is preferably contained in an amount of 10 parts by mass or less, more preferably contained in an amount of 0.1 parts by mass or more and 10 parts by mass or less, and still more preferably contained in an amount of 0.5 parts by mass or more and 8 parts by mass or less, based on 100 parts by mass of the compound (A).

[Additional Component]

The film of the present embodiment may comprise, in addition to the compound (A), the organic peroxide (B), the hydroperoxide (C), the benzoxazine compound (D), the propenyl compound (E), the flux component (F), the inorganic filler (G), and the imidazole compound (H), one kind of or two or more kinds of additional components.

Examples of the additional component include, but are not particularly limited to, a flexibility imparting component. The flexibility imparting component is not particularly limited as long as it is a component that can impart flexibility to a layer containing the film, but examples thereof include, for example, a thermoplastic polymer compound such as a polyimide, a polyamide imide, a polystyrene, a polyolefin, a styrene-butadiene rubber (SBR), an isoprene rubber (IR), a butadiene rubber (BR), a (meth)acrylonitrile-butadiene rubber (NBR), a polyurethane, a polypropylene, a (meth)acrylic oligomer, a (meth)acrylic polymer, and a silicone resin, other than the compound (A), the benzoxazine compound (D), the propenyl compound (E), and the flux component (F). These flexibility imparting components can be used alone as one kind, or can be used in an appropriate mixture of two or more kinds.

The film of the present embodiment can also comprise a silane coupling agent as an additional component for the purposes of improving the adhesiveness of the interface between the resin and the inorganic filler, and of improving moisture absorption heat resistance. Examples of the silane coupling agent include, for example, a vinylsilane-based silane coupling agent such as vinyltrimethoxysilane and γ-methacryloxypropyltrimethoxysilane; a phenylaminosilane-based silane coupling agent such as N-phenyl-3-aminopropyltrimethoxysilane; a phenylsilane-based silane coupling agent such as trimethoxyphenylsilane; and an imidazolesilane-based silane coupling agent. These silane coupling agents can be used alone as one kind or can be used in an appropriate mixture of two or more kinds.

When the silane coupling agent is used, its content is not particularly limited, but from the viewpoints of improving moisture absorption heat resistance and of reducing the amount of volatilization at the time of the flip chip bonding, it is preferably contained in an amount of 0.05 parts by mass or more and 20 parts by mass or less based on 100 parts by mass of the compound (A).

The film of the present embodiment can also comprise a wetting and dispersing agent as an additional component for the purposes of improvement in the producibility of the laminate, dispersibility of the filler, and the like. The wetting and dispersing agent is not particularly limited as long as it is a wetting and dispersing agent that is used in general for a paint and the like. Examples thereof include, for example, Disperbyk (registered trademark) -110 (trade name), -111 (trade name), -180 (trade name), and -161 (trade name), BYK-W996 (trade name), -W9010 (trade name), and -W903 (trade name) manufactured by BYK Japan KK. These wetting and dispersing agents can be used alone as one kind, or can be used in an appropriate mixture of two or more kinds.

When the wetting and dispersing agent is used, its content is not particularly limited, but from the viewpoint of improving the producibility of the laminate, it is preferably contained in an amount of 0.1 parts by mass or more and 5 parts by mass or less, and is more preferably contained in an amount of 0.5 parts by mass or more and 3 parts by mass or less, based on 100 parts by mass of the inorganic filler (G). Note that, when two or more kinds of wetting and dispersing agents are used in combination, it is preferable that their total amount satisfy the ratio described above.

The film of the present embodiment may comprise a variety of additive agents as additional components for various purposes in the range in which the expected characteristics are not impaired. Examples of the additive agents include, for example, an ultraviolet absorbing agent, an antioxidant, a photopolymerization initiator, a fluorescent brightening agent, a photosensitizer, a dye, a pigment, a thickening agent, a lubricant, a defoaming agent, a leveling agent, a brightening agent, a flame retardant, and an ion trapping agent. These additive agents can be used alone as one kind, or can be used in an appropriate mixture of two or more kinds.

In the film of the present embodiment, although the content of each additional additive agent is not particularly limited, it is normally 0.01 to 10 parts by mass based on 100 parts by mass of the compound (A).

The film of the present embodiment is suitable for pre-applied underfill materials, and therefore, it is preferable to be in a semi-cured state (B stage). When the film is in a semi-cured state, excellent low void property and chip adhesiveness can be obtained. In the present embodiment, the semi-cured state (B stage) refers to a state where each component contained in the film has not yet begun to actively react (cure) but the film has been heated to a dry state, that is, to a state with no tackiness so that the solvent has been volatilized. It also includes a state where the solvent has been volatilized without curing even without heating. In the present embodiment, the minimum melt viscosity in the semi-cured state (B stage) is normally 50,000 Pa·s or less. Note that the minimum melt viscosity can be measured by the method described in Examples, which will be mentioned later.

The thickness of the film of the present embodiment is not particularly limited, but from the viewpoint of ensuring underfill filling properties between connection terminals at the time of mounting, it is preferably 10 μm or more and 100 μm or less, and is more preferably 10 μm or more and 50 μm or less.

[Method for Producing Film]

The method of producing the film of the present embodiment is not particularly limited as long as a film having the composition mentioned above can be obtained. As for the method for producing the film of the present embodiment, the film can be obtained by, for example, mixing the compound (A), the organic peroxide (B), and the hydroperoxide (C), as well as, if necessary, the benzoxazine compound (D), the propenyl compound (E), the flux component (F), the inorganic filler (G), the imidazole compound (H), and the additional component as appropriate; then dissolving or dispersing these components in an organic solvent to form a varnish; and applying and drying this varnish on a support. For the specific production method, reference can be made to a method for producing a laminate and Examples, which will be mentioned later. The film of the present embodiment may be peeled off from the support after drying for use, or it may be used together with the support.

The organic solvent is not particularly limited as long as it can suitably dissolve or disperse each of the components described above and does not impair the expected effects of the film of the present embodiment. Examples of the organic solvent include, for example, an alcohol such as methanol, ethanol, and propanol; a ketone such as acetone, methyl ethyl ketone (hereinafter, may be abbreviated as "MEK"), and methyl isobutyl ketone; an amide such as dimethylacetamide and dimethylformamide; and an aromatic hydrocarbon such as toluene and xylene. These organic solvents can be used alone as one kind, or can be used in an appropriate mixture of two or more kinds.

As the support, those publicly known can be used and there is no particular limitation thereon, but it is preferably a resin film. Examples of the resin film include, for example, a polyimide film, a polyamide film, a polyester film, a polyethylene terephthalate (PET) film, a polybutylene terephthalate (PBT) film, a polypropylene (PP) film, a polyethylene (PE) film, a polyethylene naphthalate film, a polyvinyl alcohol film, and a triacetyl acetate film. Among the above, a PET film is preferable.

[Laminate]

A laminate of the present embodiment comprises: a supporting material; and a layer containing the film of the present embodiment laminated on the supporting material. Such a laminate can be obtained by attaching the film of the present embodiment to the supporting material. As the supporting material, there is no particular limitation, but a polymer film can be used. Examples of the material of the polymer film include, for example, a film containing at least one or more resins selected from the group consisting of a polyvinyl chloride, a polyvinylidene chloride, a polybutene, a polybutadiene, a polyurethane, an ethylene-vinyl acetate copolymer, a polyester such as a polyethylene terephthalate, a polyethylene naphthalate and a polybutylene terephthalate, a polyethylene, a polypropylene, an ethylene-propylene copolymer, a polymethylpentene, a polyimide, and a polyamide; and a mold releasing film formed by coating the surface of these films with a mold releasing agent. Among the above, a polyester, a polyimide, and a polyamide are preferable, and a polyethylene terephthalate, which is one kind of polyester, is more preferable.

Although the thickness of the supporting material is not particularly limited, it is preferably 10 to 100 μm from the standpoints of producibility of the laminate, for example, stability of the coating thickness in the case of coating the supporting material with the film, and of conveyance properties of the laminate. The lower limit of the thickness of the supporting substrate is more preferably 12 μm or more, still more preferably 25 μm or more, and yet even more preferably 30 μm or more from the standpoint of ensuring the yield upon producing the laminate. The upper limit of the thickness of the supporting material is more preferably 80 μm or less and is still more preferably 50 μm or less from the standpoint that the supporting material is peeled in the middle of the process and is not present in the end as a constituent member of the semiconductor device and from the standpoint of production costs of the laminate.

The method for producing the laminate of the present embodiment by forming a layer containing the film of the present embodiment (hereinafter, also simply referred to as a "film layer") on the supporting material is not particularly limited. Examples of such a production method include, for example, an approach in which the surface of the supporting material is coated with a varnish formed by dissolving or dispersing the film of the present embodiment in an organic solvent, and dried under heating and/or reduced pressure, and the solvent is removed to solidify the film of the present embodiment, thereby forming the film layer. The drying conditions are not particularly limited, but the drying is carried out such that the content ratio of the organic solvent to the film layer is normally 10 parts by mass or less, and preferably 5 parts by mass or less based on the total amount of the film layer (100 parts by mass). Conditions for achieving such drying can be adjusted as appropriate depending on the type of the organic solvent in the varnish and the amount to be compounded. For example, in the case of a varnish containing 10 to 120 parts by mass of methyl ethyl ketone based on 100 parts by mass of the compound (A), the standard drying time is about 3 to 10 minutes under heating conditions of 90 to 160° C. at 1 atm. Note that the film layer described above can function as an insulating layer.

[Semiconductor Wafer with Film Layer and Substrate for Mounting Semiconductor with Film Layer]

A semiconductor wafer with a film layer of the present embodiment comprises: a semiconductor wafer; and the laminate of the present embodiment laminated on the semiconductor wafer, wherein the layer containing the film is laminated on the semiconductor wafer. Also, a substrate for mounting a semiconductor with a film layer of the present embodiment comprises: the substrate for mounting the semiconductor; and the laminate of the present embodiment laminated on the substrate for mounting the semiconductor, wherein the layer containing the film is laminated on the substrate for mounting the semiconductor.

The method for fabricating the semiconductor wafer with a film layer of the present embodiment is not particularly limited, but for example, it is obtained by pasting the semiconductor wafer and the film layer together such that the film layer of the laminate of the present embodiment and the surface of the semiconductor wafer on which the electrodes have been formed, that is, the surface on which the joint with the substrate will take place, face each other. In addition, the method for fabricating the substrate for mounting the semiconductor with a film layer of the present embodiment is not particularly limited, but for example, it is obtained by pasting the substrate for mounting the semiconductor and the film layer together such that the film layer of the laminate of the present embodiment and the surface of the substrate for mounting the semiconductor on which a chip is mounted face each other.

Although the method for pasting the laminate of the present embodiment and the semiconductor wafer or substrate for mounting the semiconductor together is not particularly limited, a vacuum pressing laminator can be suitably used. In this case, a method is preferable in which pressure is applied to the laminate of the present embodiment via an elastic body such as rubber, thereby pasting the laminate and the semiconductor wafer or substrate for mounting the semiconductor together. The lamination conditions are not particularly limited as long as they are conditions generally used in the art, and for example, the lamination is performed at a temperature of 50 to 140° C., with a contact pressure in the range of 1 to 11 $kgf/cm^2$, and under an atmospheric reduced pressure of 20 hPa or less. Subsequently to the lamination step, smoothing of the pasted laminate may be performed through hot pressing with metal plates. The above lamination step and the smoothing step can be performed sequentially with a commercially available vacuum pressing laminator. In the laminate stuck to the semiconductor wafer or substrate for mounting the semiconductor, removal of the supporting material is performed before the flip chip bonding of the chip in any case.

[Semiconductor Device]

A semiconductor device of the present embodiment comprises the semiconductor wafer with a film layer of the present embodiment and/or the substrate for mounting the semiconductor with a film layer of the present embodiment. Although the method for producing the semiconductor device of the present embodiment is not particularly limited, examples thereof include, for example, an approach in which the semiconductor wafer with a film layer of the present embodiment is thinned with a grinding means or the like, and is divided into individual pieces with a dicing saw or the like to make the chip with the film layer, which is then mounted on the substrate for mounting the semiconductor. In addition, the chip may be mounted on the substrate for mounting the semiconductor with a film layer of the present embodiment. In the method for mounting the chip with the film layer on the substrate for mounting the semiconductor and the method for mounting the semiconductor chip on the substrate for mounting the semiconductor with the film layer, a flip chip bonder compatible with the thermocompression bonding method can be suitably used. In addition, although the case in which the chip is mounted on the substrate for mounting the semiconductor in the form of flip chip bonding is described for convenience in the present embodiment, the object to which the film of the present embodiment is applied while mounting the chip in the form of flip chip bonding does not need to be a substrate for mounting a semiconductor. For example, the film of the present embodiment may be used for a joint between a semiconductor wafer and a chip upon mounting the chip on the semiconductor wafer or for a joint between the chip of a chip laminate in which inter-chip connection is formed via TSV (Through Silicon Via) or the like, and in any case, the superiority according to the present invention can be obtained.

EXAMPLES

The present embodiment will be more specifically described below using Examples and Comparative Examples. The present embodiment is not limited in any way by the following Examples.

[Fabrication of Film and Laminate]

Example 1

The following four kinds were used in combination as the compound (A). That is, prepared were: 58.44 parts by mass of a maleimide compound represented by the above formula (6), wherein $n^3$ is 14 (average value) (BMI-1000P (trade name), manufactured by K•I Chemical Industry Co., LTD.); 10.02 parts by mass (5.01 parts by mass in terms of non-volatile portions) of a solution of bis-(3-ethyl-5-methyl-4-maleimidophenyl)methane (BMI-70 (trade name), manufactured by K•I Chemical Industry Co., LTD.) in MEK (non-volatile portions 50% by mass); 20.04 parts by mass (10.02 parts by mass in terms of non-volatile portions) of a solution of 2,2-bis{4-(4-maleimidophenoxy) phenyl}propane (BMI-80 (trade name), manufactured by K•I Chemical Industry Co., LTD.) in MEK (non-volatile portions 50% by mass); and 37.90 parts by mass (26.53 parts by mass in terms of non-volatile portions) of a MEK solution containing a maleimide compound of the above formula (8), wherein all $R^{10}$ are hydrogen atoms (MIR-3000-70MT (trade name), manufactured by Nippon Kayaku Co., Ltd., non-volatile portions 70% by mass).

In addition, 83.48 parts by mass (41.74 parts by mass in terms of non-volatile portions) of a solution of a P-d-based benzoxazine (manufactured by SHIKOKU CHEMICALS CORPORATION) in MEK (non-volatile portions 50% by mass) as the benzoxazine compound (D); 50.46 parts by mass (25.23 parts by mass in terms of non-volatile portions) of a solution of a propenyl group containing resin containing a structure represented by the following formula (e1) in MEK (non-volatile portions 50% by mass) as the propenyl compound (E); 100.18 parts by mass (50.09 parts by mass in terms of non-volatile portions) of a solution of a rosin-modified maleic acid resin (MALKYD No. 32 (trade name), manufactured by Arakawa Chemical Industries, Ltd.) in MEK (non-volatile portions 50% by mass) as the flux component (F); 417.44 parts by mass (208.72 parts by mass in terms of non-volatile portions) of a slurry silica (YA050C-MJE (trade name), solid content: 50%, average particle diameter: 50 nm, manufactured by Admatechs Company Limited.) as the inorganic filler (G); 3.74 parts by mass (1.87 parts by mass in terms of non-volatile portions) of a hydroperoxide represented by the following formula (11-1) (PERMENTA H (trade name), manufactured by NOF CORPORATION, non-volatile portions 50% by mass) as the hydroperoxide (C); 1.87 parts by mass of an organic peroxide represented by the following formula (1-1) (dicumyl peroxide, manufactured by Kishida Chemical Co., Ltd.) as the organic peroxide (B); and 5.01 parts by mass of an imidazole compound represented by the following formula (h4) (2E4MZ (trade name), manufactured by SHIKOKU CHEMICALS CORPORATION) as the imidazole compound (H) were mixed with the above four kinds of compounds (A) and the mixture was stirred for 40 minutes by using a high speed stirring apparatus, thereby obtaining a varnish.

With the obtained varnish, a polyethylene terephthalate film having a thickness of 38 μm (TR1-38 (trade name), manufactured by UNITIKA LTD.), the surface of which was coated with a mold releasing agent, was coated, and it was heated and dried at 100° C. for 5 minutes, thereby obtaining a laminate with the film layer (insulating layer) having a thickness of 30 μm. Note that, from the mass of the film, the content of the compounds (A) in the film was calculated to be 23.1% by mass.

(e1)

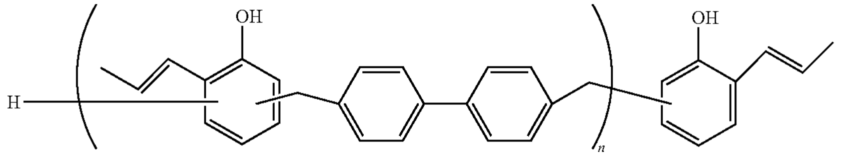

(The above formula (e1) is a mixture where n is 1 to 10.)

(11-1)

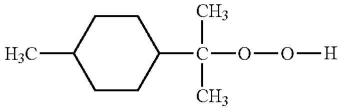

-continued (1-1)

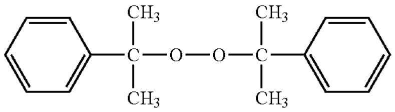

(h4)

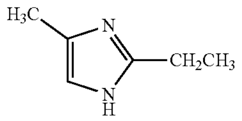

Example 2

A varnish was prepared in the same manner as in Example 1, except that the amount of PERMENTA H compounded as the hydroperoxide (C) was changed to 0.47 parts by mass, and a laminate with the film layer having a thickness of 30 μm was obtained.

Example 3

A varnish was prepared in the same manner as in Example 1, except that 1.87 parts by mass of a hydroperoxide represented by the following formula (10-1) (PERCUMYL P (trade name), manufactured by NOF CORPORATION) was used as the hydroperoxide (C) instead of PERMENTA H, and a laminate with the film layer having a thickness of 30 μm was obtained.

(10-1)

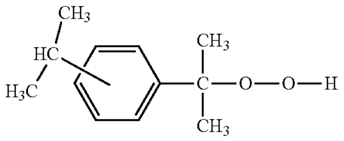

Example 4

A varnish was prepared in the same manner as in Example 3, except that the amount of PERCUMYL P compounded as the hydroperoxide (C) was changed to 0.47 parts by mass, and a laminate with the film layer having a thickness of 30 μm was obtained.

Example 5

A varnish was prepared in the same manner as in Example 1, except that 1.87 parts by mass of a hydroperoxide represented by the following formula (10-2) (PERCUMYL H-80 (trade name), manufactured by NOF CORPORATION) was used as the hydroperoxide (C) instead of PERMENTA H, and a laminate with the film layer having a thickness of 30 μm was obtained.

(10-2)

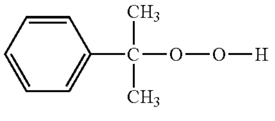

Example 6

A varnish was prepared in the same manner as in Example 5, except that the amount of PERCUMYL H-80 compounded as the hydroperoxide (C) was changed to 0.47 parts by mass, and a laminate with the film layer having a thickness of 30 μm was obtained.

Example 7

A varnish was prepared in the same manner as in Example 1, except that 1.17 parts by mass of an organic peroxide represented by the following formula (2-1) (PERBUTYL P (trade name), manufactured by NOF CORPORATION) was used as the organic peroxide (B) instead of dicumyl peroxide and the amount of PERMENTA H compounded as the hydroperoxide (C) was changed to 1.17 parts by mass, and a laminate with the film layer having a thickness of 30 μm was obtained.

(2-1)

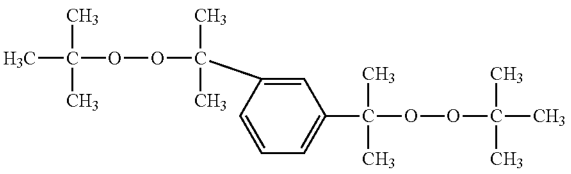

Example 8

A varnish was prepared in the same manner as in Example 7, except that the amount of PERBUTYL P compounded as the organic peroxide (B) was changed to 2.50 parts by mass and the amount of PERMENTA H compounded as the hydroperoxide (C) was changed to 0.87 parts by mass, and a laminate with the film layer having a thickness of 30 μm was obtained.

Example 9

A varnish was prepared in the same manner as in Example 1, except that 1.87 parts by mass of an organic peroxide represented by the following formula (2-2) (PERHEXA V (trade name), manufactured by NOF CORPORATION) was used as the organic peroxide (B) instead of dicumyl peroxide and the amount of PERMENTA H compounded as the hydroperoxide (C) was changed to 0.62 parts by mass, and a laminate with the film layer having a thickness of 30 μm was obtained.

(2-2)

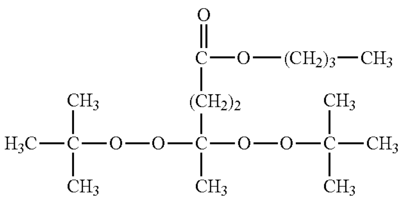

Example 10

A varnish was prepared in the same manner as in Example 1, except that 2.97 parts by mass of PERHEXA V was used as the organic peroxide (B) instead of dicumyl peroxide and 1.10 parts by mass of PERCUMYL H-80 was used as the hydroperoxide (C) instead of PERMENTA H, and a laminate with the film layer having a thickness of 30 μm was obtained.

Example 11

A varnish was prepared in the same manner as in Example 1, except that 2E4MZ as the imidazole compound (H) was not used, the amount of dicumyl peroxide compounded as the organic peroxide (B) was changed to 5.56 parts by mass, and the amount of PERMENTA H compounded as the hydroperoxide (C) was changed to 3.74 parts by mass, and a laminate with the film layer having a thickness of 30 μm was obtained.

Example 12

A varnish was prepared in the same manner as in Example 1, except that 1.87 parts by mass of a hydroperoxide represented by the following formula (12-1) (PEROCTA H (trade name), manufactured by NOF CORPORATION) was used as the hydroperoxide (C) instead of PERMENTA H, and a laminate with the film layer having a thickness of 30 μm was obtained.

(12-1)

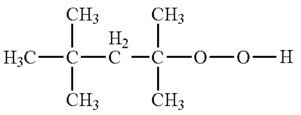

Example 13

A varnish was prepared in the same manner as in Example 11, except that 3.74 parts by mass of PEROCTA H was used as the hydroperoxide (C) instead of PERMENTA H, and a laminate with the film layer having a thickness of 30 μm was obtained.

Example 14

A varnish was prepared in the same manner as in Example 1, except that 1.87 parts by mass of a hydroperoxide represented by the following formula (12-2) (LUPEROX TAH (trade name), manufactured by ARKEMA Yoshitomi, Ltd.) was used as the hydroperoxide (C) instead of PERMENTA H, and a laminate with the film layer having a thickness of 30 μm was obtained.

(12-2)

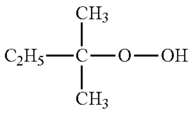

Example 15

A varnish was prepared in the same manner as in Example 11, except that 3.74 parts by mass of LUPEROX TAH was used as the hydroperoxide (C) instead of PERMENTA H, and a laminate with the film layer having a thickness of 30 μm was obtained.

Example 16

A varnish was prepared in the same manner as in Example 11, except that, among the above four kinds of compounds (A) used, 10.32 parts by mass of a maleimide compound represented by the above formula (5), wherein $n^2$ is 1 to 3 (BMI-2300 (trade name), manufactured by Daiwa Kasei Industry Co., LTD.) was used instead of MIR-3000-70MT, the amount of BMI-70 compounded was changed to 15.62 parts by mass (in terms of non-volatile portions), and the amount of BMI-80 compounded was changed to 15.62 parts by mass (in terms of non-volatile portions), and a laminate with the film layer having a thickness of 30 μm was obtained.

Comparative Example 1

A varnish was prepared in the same manner as in Example 1, except that PERMENTA H as the hydroperoxide (C) was not used, and a laminate with the film layer having a thickness of 30 μm was obtained.

Comparative Example 2

A varnish was prepared in the same manner as in Comparative Example 1, except that the amount of dicumyl peroxide compounded as the organic peroxide (B) was changed to 10.85 parts by mass, and a laminate with the film layer having a thickness of 30 μm was obtained.

Comparative Example 3

A varnish was prepared in the same manner as in Example 1, except that dicumyl peroxide as the organic peroxide (B) was not used, and a laminate with the film layer having a thickness of 30 μm was obtained.

Comparative Example 4

A varnish was prepared in the same manner as in Comparative Example 3, except that the amount of PERMENTA H compounded as the hydroperoxide (C) was changed to 10.85 parts by mass, and a laminate with the film layer having a thickness of 30 μm was obtained.

Comparative Example 5

A varnish was prepared in the same manner as in Example 3, except that dicumyl peroxide as the organic peroxide (B) was not used, and a laminate with the film layer having a thickness of 30 μm was obtained.

Comparative Example 6

A varnish was prepared in the same manner as in Comparative Example 5, except that the amount of PERCUMYL P compounded as the hydroperoxide (C) was changed to 10.85 parts by mass, and a laminate with the film layer having a thickness of 30 μm was obtained.

Comparative Example 7

A varnish was prepared in the same manner as in Example 5, except that dicumyl peroxide as the organic peroxide (B)

was not used, and a laminate with the film layer having a thickness of 30 μm was obtained.

Comparative Example 8

A varnish was prepared in the same manner as in Comparative Example 7, except that the amount of PERCUMYL H-80 compounded as the hydroperoxide (C) was changed to 10.85 parts by mass, and a laminate with the film layer having a thickness of 30 μm was obtained.

Comparative Example 9

A varnish was prepared in the same manner as in Example 1, except that 1.87 parts by mass of an organic peroxide represented by the following formula (1') (PERBUTYL D (trade name), manufactured by NOF CORPORATION) was used as the organic peroxide (B) instead of dicumyl peroxide, and a laminate with the film layer having a thickness of 30 μm was obtained.

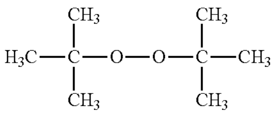

(1')

Comparative Example 10

A varnish was prepared in the same manner as in Comparative Example 9, except that 2E4MZ as the imidazole compound (H) was not used, the amount of PERMENTA H compounded as the hydroperoxide (C) was changed to 3.74 parts by mass, and the amount of PERBUTYL D compounded as the organic peroxide (B) was changed to 5.56 parts by mass, and a laminate with the film layer having a thickness of 30 μm was obtained.

Comparative Example 11

A varnish was prepared in the same manner as in Comparative Example 3, except that 1.87 parts by mass of a hydroperoxide represented by the following formula (12-3) (LUPEROX TBH (trade name), manufactured by ARKEMA Yoshitomi, Ltd.) was used as the hydroperoxide (C) instead of PERMENTA H, and a laminate with the film layer having a thickness of 30 μm was obtained.

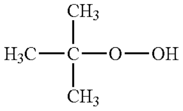

(12-3)

Comparative Example 12

A varnish was prepared in the same manner as in Comparative Example 11, except that the amount of LUPEROX TBH compounded as the hydroperoxide (C) was changed to 3.74 parts by mass, and a laminate with the film layer having a thickness of 30 μm was obtained.

[Evaluation of Laminates]

(1) Storage Stability of Varnish

The viscosity (a) of the varnishes obtained in Examples 1 to 15 and Comparative Examples 1 to 11 was measured at 25° C. using a B type viscometer (manufactured by TOKYO KEIKI INC.), and after leaving the varnishes in a hermetically closed container at 25° C. for one week, the viscosity (b) was measured again using the B type viscometer. The rate of change in viscosity after one week had passed was calculated according to the following equation, and marked as AA when the rate of change in viscosity was less than 10%, as A when it was 10% or more and less than 20%, as B when it was 20% or more and less than 40%, as C when it was 40% or more, and as D when gelation of the varnish was confirmed at the time of varnish fabrication. The results are shown in Tables 1 to 2.

$$\text{Rate of Change in Viscosity}=\{|\text{Viscosity }(b)-\text{Viscosity }(a)|/\text{Viscosity }(a)\}\times 100$$

(2) Bendability

The laminates obtained in Examples 1 to 15 and Comparative Examples 1 to 11 were cut into strips of 5 cm×10 cm, and they were wound around a metal tube with a predetermined outer diameter at room temperature such that the polyethylene terephthalate film, which is the supporting material, was placed inside; retained for 5 seconds; and then unwound. After repeating this operation 10 times, the presence or absence of cracks in the resin composition layer was visually confirmed, thereby performing evaluation of flexibility. The laminates were marked as AA when the smallest outer diameter of the metal tube where no cracks were confirmed in the resin composition layer was 10 mm or less, as A when the smallest outer diameter was 10 mm or more and 20 mm or less, as B when the smallest outer diameter was 20 mm or more and 60 mm or less, and as C when the smallest outer diameter was 60 mm or more. The results are shown in Tables 1 to 2.

(3) Fluxability

Resin powder obtained by crushing the film layers obtained in Examples 1 to 15 and Comparative Examples 1 to 11 was scattered on the shiny surface of an electrolytic copper foil with a thickness of 12 μm (3EC-III (trade name), manufactured by MITSUI MINING & SMELTING CO., LTD.), and a solder ball with a diameter of 0.5 mm (ECO SOLDER (registered trademark) ball M705 (trade name), Sn-3.0 Ag-0.5 Cu alloy, manufactured by Senju Metal Industry Co., Ltd.) was placed thereon. This was heated on a hot plate kept at 235° C. for 1 minute to melt the solder on the copper foil, and then the solder was cooled at room temperature. The contact angle of the solder ball wetly spread on the copper foil was measured, thereby evaluating the fluxability. For the contact angle of the solder ball, the radius (c) of the solder ball melted and wetly spread on the copper foil and the height (d) of the solder ball were determined by using a digital microscope (KH-7700 (trade name), manufactured by HIROX CO., LTD.) and the contact angle was calculated according to the following equation.

$$\text{Contact Angle of Solder Ball}=2\arctan\{(d)/(c)\}$$

The case where the contact angle of the solder ball was less than 1.60 radians was marked as AA, the case where the contact angle was 1.60 radians or more and less than 2.00 radians was marked as A, the case where the contact angle was 2.00 radians or more and less than 2.20 radians was marked as B, and the case where the contact angle was 2.20 radians or more was marked as C. The results are shown in Tables 1 to 2.

(4) Curability

For the resin powder obtained by crushing the film layers obtained in Examples 1 to 15 and Comparative Examples 1 to 11, the calorific value in the range of 30° C. to 350° C. was measured using a differential scanning calorimeter (Q100 (trade name), manufactured by TA Instruments) under conditions with a temperature increase rate of 10° C./min. The case where the calorific value (W/g) at 145° C. was 0.05 W/g or more was marked as AA, the case where it was 0.04 W/g or more and less than 0.05 W/g was marked as A, the case where it was 0.03 W/g or more and less than 0.04 W/g was marked as B, and the case where it was less than 0.03 W/g was marked as C. The results are shown in Tables 1 to 2.

(5) Voids

The laminates obtained in Examples 1 to 15 and Comparative Examples 1 to 11 were cut into 8 mm×8 mm squares and laminated on a substrate for evaluation, and then by using a flip chip bonder (LFB-2301 (trade name), manufactured by SHINKAWA LTD.), semiconductor chips having a Cu pillar constituted with copper and solder as an electrode were bonded thereto by thermocompression under conditions with a stage temperature of 70° C., a bond head temperature of 260° C., a load of 50 N, and a time of 6 seconds, thereby performing bonding. For the samples after the bonding, the presence or absence of voids in the film layer within the range of the semiconductor chip bonding area was confirmed using an ultrasonic flaw detection imaging device (μ-SDS (trade name), manufactured by Krautkramer Japan Co., Ltd. The case where the proportion of voids was less than 5% was marked as AA, the case where the proportion was less than 10% and 5% or more was marked as A, the case where the proportion was less than 30% and 10% or more was marked as B, and the case where the proportion was 30% or more was marked as C. The results are shown in Tables 1 to 2.

(6) Minimum Melt Viscosity 1 g of the resin powder obtained by crushing the film layer obtained in Examples 1 to 15 and Comparative Examples 1 to 11 was weighed and molded into a tablet form with a diameter of 25 mm and a thickness of 1.5 mm using a tablet press (SSP-10A (trade name), manufactured by Shimadzu Corporation) under conditions with a pressure of 20 kN and a time of 5 minutes. Using a rheometer (ARES-G2 (trade name), manufactured by TA Instruments), the viscosity in the range of 40° C. to 260° C. was measured under conditions with a temperature increase rate of 10° C./min. The case where the minimum melt viscosity was 10000 Pa·s or more and less than 50000 Pa·s was marked as AA, the case where the minimum melt viscosity was 50000 Pa·s or more and less than 70000 Pa·s, or 1000 Pa·s or more and less than 10000 Pa·s was marked as A, the case where the minimum melt viscosity was 70000 Pa·s or more and less than 100000 Pa·s, or 100 Pa·s or more and less than 1000 Pa·s was marked as B, and the case where the minimum melt viscosity was 100000 Pa·s or more or less than 100 Pa·s was marked as C. The results are shown in Tables 1 to 2.

TABLE 1

| | Example 1 | Example 2 | Example 3 | Example 4 | Example 5 | Example 6 | Example 7 | Example 8 | Example 9 | Example 10 | Example 11 | Example 12 | Example 13 | Example 14 | Example 15 | Example 16 |
|---|---|---|---|---|---|---|---|---|---|---|---|---|---|---|---|---|
| Storage stability of varnish | AA | AA | AA | AA | AA | AA | AA | AA | AA | AA | AA | AA | AA | AA | AA | AA |
| Bendability | AA | AA | AA | AA | AA | AA | AA | AA | AA | AA | AA | AA | AA | AA | AA | AA |
| Fluxability | A | AA | A | AA | A | AA | A | AA | A | A | AA | A | AA | A | AA | AA |
| Curability | AA | A | AA | A | AA | A | AA | AA | AA | AA | AA | AA | AA | AA | AA | AA |
| Voids | AA | AA | AA | AA | AA | AA | A | A | A | AA | AA | AA | AA | A | A | AA |
| Minimum melt viscosity | AA | AA | AA | AA | AA | AA | AA | AA | AA | AA | AA | AA | AA | AA | AA | A |

TABLE 2

| | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 | Comparative Example 12 |
|---|---|---|---|---|---|---|---|---|---|---|---|---|
| Storage stability of varnish | AA | AA | AA | AA | AA | AA | AA | AA | AA | AA | AA | AA |
| Bendability | AA | AA | AA | AA | AA | AA | AA | AA | AA | AA | AA | AA |
| Fluxability | AA | B | AA | AA | AA | AA | AA | AA | AA | AA | AA | AA |
| Curability | A | A | AA | AA | A | AA | A | AA | AA | AA | A | A |
| Voids | B | A | C | C | C | C | C | C | C | C | B | B |
| Minimum melt viscosity | AA | AA | A | A | A | A | A | A | A | A | A | A |

The present application claims the priority based on the Japanese patent application (Japanese Patent Application No. 2019-122335) filed on Jun. 28, 2019, the contents of which are incorporated herein by reference.

INDUSTRIAL APPLICABILITY

The film of the present embodiment is excellent in balance of a variety of physical properties, such as storage stability, flexibility, fluxability, curability, low void property, and melt viscosity, and is thus suitable as a pre-applied underfill material. In addition, since the film of the present embodiment is excellent in fluxability, it can impart high reliability that can withstand use for a long period of time in laminates obtained through the joint between a chip and a substrate, joint between a chip and a semiconductor wafer, and joint between a chip and another chip.

The invention claimed is:

1. A film comprising:

a compound (A) comprising:

2,2-bis{4-(4-maleimidophenoxy)phenyl}propane;

a maleimide compound represented by the following formula (6)

(6)

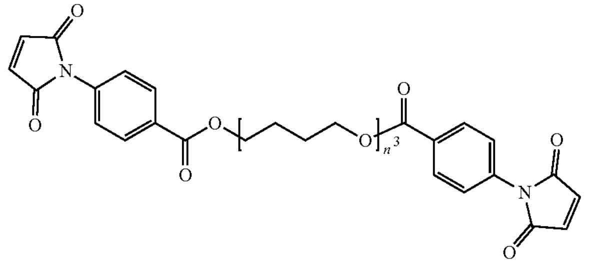

wherein $n^3$ represents an integer of 1 or more and 30 or less;

a maleimide compound represented by the following formula (7)

(7)

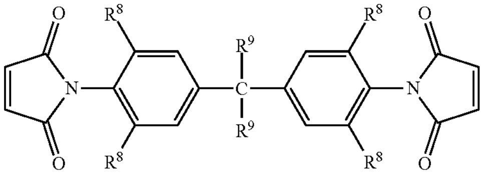

wherein each $R^8$ independently represents a hydrogen atom, a methyl group, or an ethyl group, and each $R^9$ independently represents a hydrogen atom or a methyl group; and a maleimide compound represented by the following formula (8)

(8)

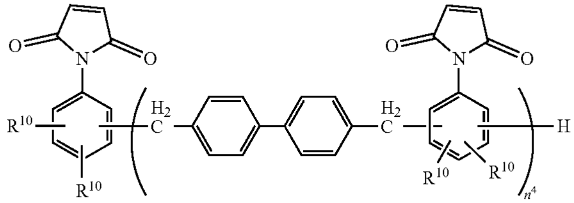

wherein each $R^{10}$ independently represents a hydrogen atom, an alkyl group having 1 to 5 carbon atoms, or a phenyl group, and n4 represents an integer of 1 or more and 10 or less;

an organic peroxide (B) comprising at least one selected from the group consisting of organic peroxides represented by the following formula (1) and the following formula (2); and a hydroperoxide (C):

(1)

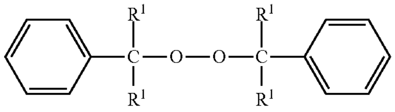

wherein each $R^1$ independently represents a hydrogen atom, a methyl group, or an ethyl group;

(2)

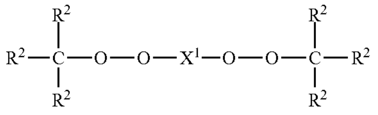

wherein each $R^2$ independently represents a hydrogen atom, a methyl group, or an ethyl group, and $X^1$ represents a group represented by the following formula (3) or (4);

(3)

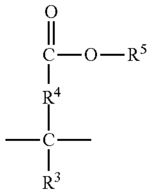

wherein $R^3$ represents a hydrogen atom, a methyl group, or an ethyl group, $R^4$ represents an alkylene group having 1 or more and 3 or less carbon atoms, and $R^5$ represents a hydrogen atom or an alkyl group having 1 or more and 6 or less carbon atoms;

(4)

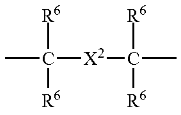

wherein each $R^6$ independently represents a hydrogen atom, a methyl group, or an ethyl group, and $X^2$ represents a group represented by the following formulae (a) to (c); and (a)

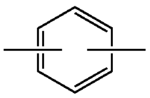

(b)

$-C\equiv C-$ (c)

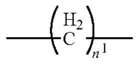

wherein $n^1$ represents an integer of 1 or more and 5 or less.

2. The film according to claim 1, wherein the compound (A) further comprises at least one selected from the group consisting of 1,2-bis(maleimido)ethane, 1,4-bis(maleimido) butane, 1,6-bis(maleimido)hexane, N,N'-1,3-phenylenedimaleimide, N,N'-1,4-phenylenedimaleimide, N-phenylmaleimide, a maleimide compound represented by the following formula (5), and a bismaleimide compound having a constituent unit represented by the following formula (9) and maleimide groups at both ends:

(5)

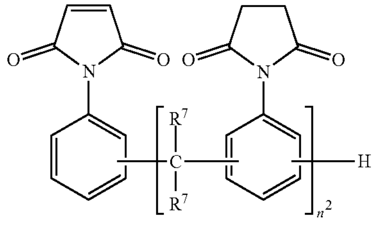

wherein each $R^7$ independently represents a hydrogen atom or a methyl group, and n2 represents an integer of 1 or more;

and (9)

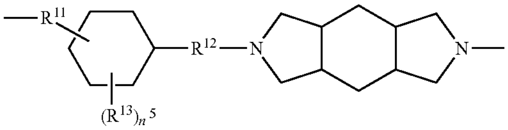

wherein $R^{11}$ represents a linear or branched alkylene group having 1 or more and 16 or less carbon atoms, or a linear or branched alkenylene group having 2 or more and 16 or less carbon atoms, $R^{12}$ represents a linear or branched alkylene group having 1 or more and 16 or less carbon atoms, or a linear or branched alkenylene group having 2 or more and 16 or less carbon atoms, each $R^{13}$ independently represents a hydrogen atom, a linear or branched alkyl group having 1 or more and 16 or less carbon atoms, or a linear or branched alkenyl group having 2 or more and 16 or less carbon atoms, and n5 represents an integer of 1 or more and 10 or less.

3. The film according to claim 1, wherein the hydroperoxide (C) comprises at least one selected from the group consisting of a hydroperoxide represented by the following formula (10), a hydroperoxide represented by the following formula (11), and a hydroperoxide represented by the following formula (12):

(10)

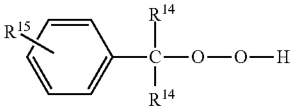

wherein each $R^{14}$ independently represents a hydrogen atom or a methyl group, and $R^{15}$ represents a hydrogen atom, a methyl group, an isopropyl group, or a tert-butyl group;

(11)

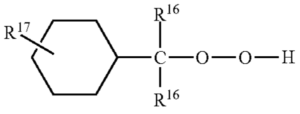

wherein each $R^{16}$ independently represents a hydrogen atom or a methyl group, and $R^{17}$ represents a hydrogen atom, a methyl group, an isopropyl group, or a tert-butyl group; and (12)

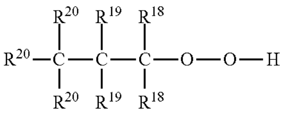

wherein each $R^{18}$ independently represents a hydrogen atom or a methyl group, each $R^{19}$ independently represents a hydrogen atom or a methyl group, and each $R^{20}$ independently represents a hydrogen atom or a methyl group.

4. The film according to claim 1, wherein the hydroperoxide (C) has a molecular weight of 100 or more.

5. The film according to claim 1, wherein the hydroperoxide (C) comprises at least one selected from the group consisting of p-menthane hydroperoxide, diisopropylbenzene hydroperoxide, cumene hydroperoxide, 1,1,3,3-tetramethylbutyl hydroperoxide, and tert-amyl hydroperoxide.

6. The film according to claim 1, wherein the organic peroxide (B) comprises at least one selected from the group consisting of dicumyl peroxide, n-butyl-4,4-di-(tert-butylperoxy) valerate, di(2-tert-butylperoxyisopropyl)benzene, 2,5-dimethyl-2,5-bis(tert-butylperoxy)hexyne-3, and 2,5-dimethyl-2,5-bis(tert-butylperoxy)hexane.

7. The film according to claim 1, further comprising a benzoxazine compound (D) having an oxazine ring as a basic skeleton.

8. The film according to claim 7, wherein the benzoxazine compound (D) comprises at least one selected from the group consisting of compounds represented by the following formula (17) and the following formula (18):

(17)

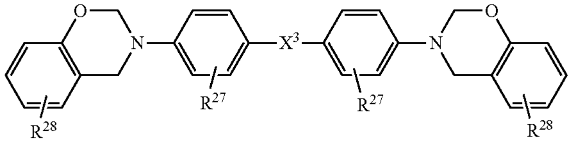

wherein each $R^{27}$ independently represents a hydrogen atom, an aryl group, an aralkyl group, an alkenyl group, an alkyl group, or a cycloalkyl group, each $R^{28}$ independently represents a hydrogen atom, an aryl group, an aralkyl group, an alkenyl group, an alkyl group, or a cycloalkyl group, and $X^3$ represents an alkylene group, a group represented by the following formula (19), a group represented by the formula "—$SO_2$—", a group represented by the formula "—CO—", an oxygen atom, or a single bond;

(18)

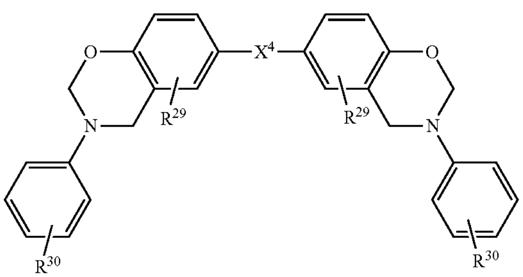

wherein each $R^{29}$ independently represents a hydrogen atom, an aryl group, an aralkyl group, an alkenyl group, an alkyl group, or a cycloalkyl group, each $R^{30}$ independently represents a hydrogen atom, an aryl group, an aralkyl group, an alkenyl group, an alkyl group, or a cycloalkyl group, and $X^4$ represents an alkylene group, a group represented by the following formula (19), a group represented by the formula "—$SO_2$—", a group represented by the formula "—CO—", an oxygen atom, or a single bond; and (19)

$$-O-(Y)_{n^8}-O-$$

wherein Y is an alkylene group or a hydrocarbon group having 6 or more and 30 or less carbon atoms and having an aromatic ring, and $n^8$ represents an integer of 0 or more.

9. The film according to claim 7, wherein the benzoxazine compound (D) comprises at least one selected from the group consisting of a compound represented by the following formula (20), a compound represented by the following formula (21), a compound represented by the following formula (22), a compound represented by the following formula (23), a compound represented by the following formula (24), and a compound represented by the following formula (25):

(20)

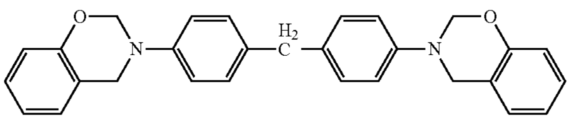

(21)

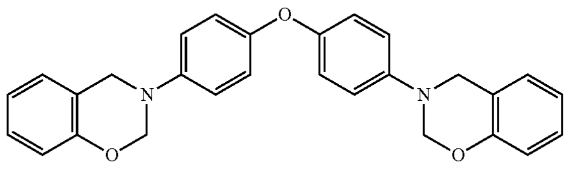

-continued (22)

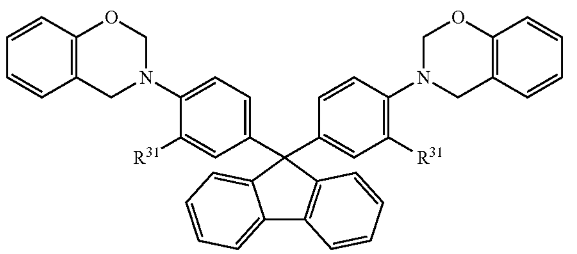

wherein each $R^{31}$ independently represents a hydrogen atom or a hydrocarbon group having 1 to 4 carbon atoms;

(23)

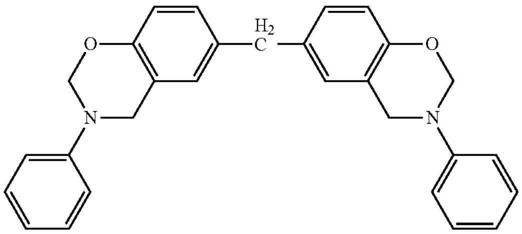

(24)

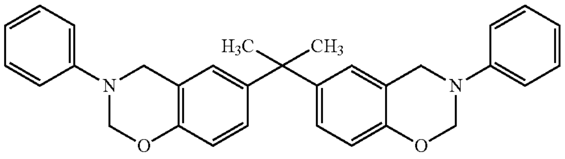

(25)

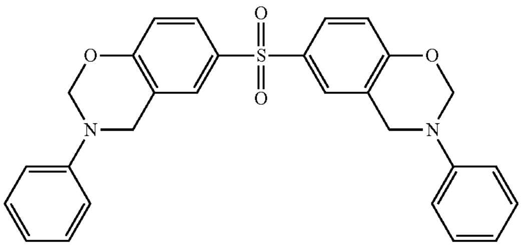

10. The film according to claim 7, wherein a content of the benzoxazine compound (D) is 5 parts by mass or more and 50 parts by mass or less based on 100 parts by mass of the compound (A).

11. The film according to claim 1, further comprising a propenyl compound (E).

12. The film according to claim 11, wherein a content of the propenyl compound (E) is 5 parts by mass or more and 50 parts by mass or less based on 100 parts by mass of the compound (A).

13. The film according to claim 1, further comprising a flux component (F).

14. The film according to claim 13, wherein a content of the flux component (F) is 5 parts by mass or more and 60 parts by mass or less based on 100 parts by mass of the compound (A).

15. The film according to claim 1, further comprising an inorganic filler (G).

16. The film according to claim 15, wherein the inorganic filler (G) has an average particle diameter of 3 μm or less.

17. The film according to claim 15, wherein the inorganic filler (G) comprises at least one selected from the group consisting of silica, aluminum hydroxide, alumina, boehmite, boron nitride, aluminum nitride, magnesium oxide, and magnesium hydroxide.

18. The film according to claim 15, wherein a content of the inorganic filler (G) is 300 parts by mass or less based on 100 parts by mass of the compound (A).

19. The film according to claim 1, further comprising an imidazole compound (H).

20. The film according to claim 19, wherein a content of the imidazole compound (H) is 10 parts by mass or less based on 100 parts by mass of a total amount of the compound (A).

21. The film according to claim 1, having a thickness of 10 μm or more and 100 μm or less.

22. The film according to claim 1, for use in a pre-applied underfill material.

23. A laminate comprising:

a supporting material; and a layer comprising the film according to claim 1 laminated on the supporting material.

24. A semiconductor wafer with a film layer, comprising:

the semiconductor wafer; and the laminate according to claim 23 laminated on the semiconductor wafer, wherein the layer comprising the film is laminated on the semiconductor wafer.

25. A semiconductor device comprising the semiconductor wafer with the film layer according to claim 24.

26. A substrate for mounting a semiconductor with a film layer, comprising:

the substrate for mounting the semiconductor; and the laminate according to claim 23 laminated on the substrate for mounting the semiconductor, wherein the layer comprising the film is laminated on the substrate for mounting the semiconductor.

27. A semiconductor device comprising the substrate for mounting the semiconductor with the film layer according to claim 26.

* * * * *